US011790984B1

(12) United States Patent
Bregman et al.

(10) Patent No.: US 11,790,984 B1
(45) Date of Patent: Oct. 17, 2023

(54) CLUSTERING FOR READ THRESHOLDS HISTORY TABLE COMPRESSION IN NAND STORAGE SYSTEMS

(71) Applicant: Kioxia Corporation, Tokyo (JP)

(72) Inventors: Nimrod Bregman, Tel Aviv (IL); Ofir Kanter, Haifa (IL)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/703,199

(22) Filed: Mar. 24, 2022

(51) Int. Cl.
  *G11C 11/4099* (2006.01)
  *G11C 11/4096* (2006.01)
  *G11C 11/54* (2006.01)
  *G06F 18/22* (2023.01)
  *G06F 18/214* (2023.01)

(52) U.S. Cl.
  CPC ........ *G11C 11/4099* (2013.01); *G06F 18/214* (2023.01); *G06F 18/22* (2023.01); *G11C 11/4096* (2013.01); *G11C 11/54* (2013.01)

(58) Field of Classification Search
  CPC .......................... G11C 11/4099; G11C 11/54
  USPC ...................................................... 365/185.2
  See application file for complete search history.

(56) References Cited

U.S. PATENT DOCUMENTS

| | | | | |
|---|---|---|---|---|
| 8,179,719 B1* | 5/2012 | Yang | ......................... | G11C 8/10 365/185.23 |
| 2012/0307559 A1* | 12/2012 | Shen | ................... | G11C 11/5621 365/185.03 |
| 2022/0245109 A1* | 8/2022 | Hatami-Hanza | ......... | G06N 7/01 |

\* cited by examiner

*Primary Examiner* — Anthan Tran
(74) *Attorney, Agent, or Firm* — Foley & Lardner LLP

(57) ABSTRACT

A flash memory system may include a flash memory and a circuit for performing operations on the flash memory. The circuit may be configured to obtain reference voltages from one or more read samples, and a plurality of sets of reference voltages. The circuit may be configured to obtain a plurality of distances, each being a distance between a point corresponding to the obtained reference voltages and a point corresponding to a respective set of reference voltages. The circuit may be configured to determine a first set of reference voltages such that a distance between the point corresponding to the obtained reference voltages and a point corresponding to the first set of reference voltage is a minimum distance of the plurality of distances. The circuit may be configured to perform read operations on locations of the flash memory with the first set of reference voltages.

20 Claims, 14 Drawing Sheets

US 11,790,984 B1

CLUSTERING FOR READ THRESHOLDS HISTORY TABLE COMPRESSION IN NAND STORAGE SYSTEMS

TECHNICAL FIELD

The present arrangements relate generally to system and method for compressing or quantizing historical read thresholds, and more particularly to system and method for compressing or quantizing historical read thresholds.

BACKGROUND

As the number and types of computing devices continue to expand, so does the demand for memory used by such devices. Example memory devices include volatile memory (e.g., Random Access Memory (RAM)) and non-volatile memory. One popular type of non-volatile memory is flash memory or NAND-type flash. A NAND flash memory array includes rows and columns (strings) of cells. A cell may include a transistor. In NAND flash devices, compression or quantization of read thresholds is performed to conserve memory. Improvements in compression or quantization of read thresholds in NAND flash devices remain desired.

SUMMARY

The present arrangements relate to system and method for compressing or quantizing historical read thresholds using a weighted K-means clustering.

According to certain aspects, arrangements provide a method for performing operations on a flash memory. The method may include obtaining reference voltages from one or more read samples, and a plurality of sets of reference voltages. The method may include obtaining a plurality of distances, each being a distance between a point corresponding to the obtained reference voltages and a point corresponding to a respective set of reference voltages. The method may include determining a first set of reference voltages such that a distance between the point corresponding to the obtained reference voltages and a point corresponding to the first set of reference voltage is a minimum distance of the plurality of distances. The method may include performing read operations on locations of the flash memory with the first set of reference voltages.

According to other aspects, arrangements provide a flash memory system including a flash memory and a circuit for performing operations on the flash memory. The circuit may be configured to obtain reference voltages from one or more read samples, and a plurality of sets of reference voltages. The circuit may be configured to obtain a plurality of distances, each being a distance between a point corresponding to the obtained reference voltages and a point corresponding to a respective set of reference voltages. The circuit may be configured to determine a first set of reference voltages such that a distance between the point corresponding to the obtained reference voltages and a point corresponding to the first set of reference voltage is a minimum distance of the plurality of distances. The circuit may be configured to perform read operations on locations of the flash memory with the first set of reference voltages.

BRIEF DESCRIPTION OF THE DRAWINGS

These and other aspects and features of the present arrangements will become apparent to those ordinarily skilled in the art upon review of the following description of specific arrangements in conjunction with the accompanying figures, wherein.

DETAILED DESCRIPTION

According to certain aspects, arrangements in the present disclosure relate to techniques for performing an iterative soft decoding based on a result of a previous iteration to reduce decoding complexity.

Figure 1:
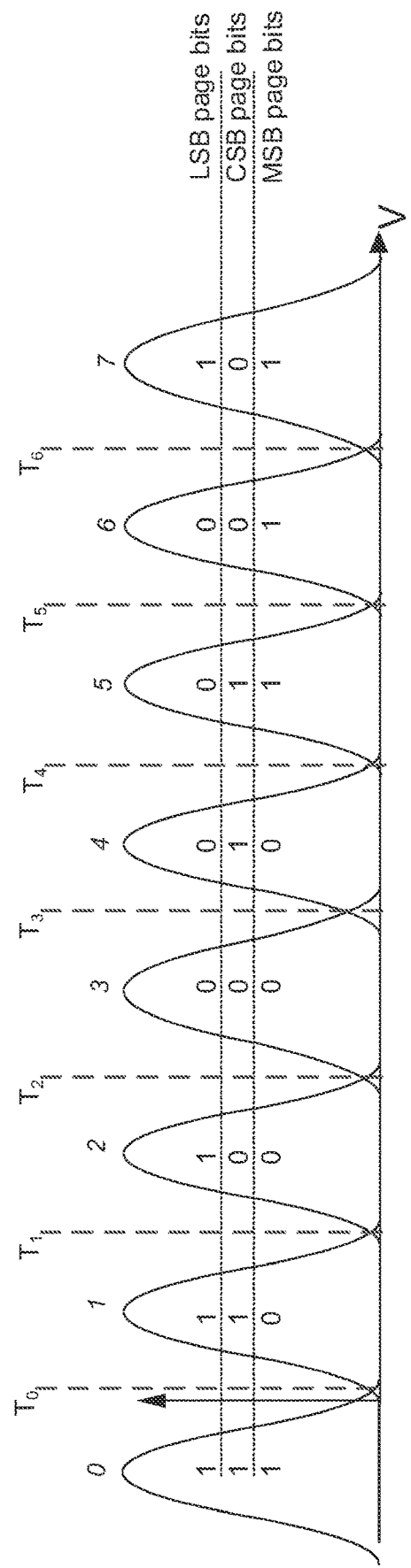
FIG. 1 illustrates threshold voltage distribution in a conventional three bits per cell (bpc) flash device.

FIG. 1 illustrates threshold voltage distribution in a conventional three bits per cell (bpc) flash device. FIG. 1 shows a voltage threshold distribution of a 3 bits per cell (bpc) flash memory device. The voltage threshold (VT) distribution includes eight lobes. An MSB (most significant bit) page read requires using thresholds T0, T4. For reading CSB (center significant bit) pages the read thresholds (or reference voltages) T1, T3 and T5 are used. For reading LSB (least significant bit) pages the read thresholds (or reference voltages) T2 and T6 have to be used. The lower most distribution is known as the erase level.

Now, technical issues to be solved by arrangements of the present disclosure will be described. Referring to FIG. 1, an optimal set of read thresholds of a triple-level cell (TLC) device, e.g., T0 . . . T6, may be changed over time due to programming process, reading process, temperature effects, etc. The same applies to other types of devices where there is a different number of read thresholds (15 in a quad-level cell (QLC) device, for example). Thus, when obtaining an optimal set of read thresholds of a block, there is a need to save the optimal set of read thresholds of the block for later read attempts. Saving a full set of read thresholds for each block generally consumes large memory. For example, in TLC devices it may require storing seven 8-bit numbers for each block, and in QLC devices it may require storing fifteen 8-bit numbers for each block, etc. In saving such historical read thresholds, compression or quantization of read thresholds may be performed to conserve memory. However, errors (e.g., bit error rate (BER)) may be added due to such compression or quantization processes. There is a need to minimize such errors (e.g., compression errors or quantization errors) in compression or quantization of read thresholds in NAND flash devices.

To address these problems, according to certain aspects, arrangements in the present disclosure relate to techniques for representing sets of read thresholds (or reference voltages) as points in a multi-dimensional space (e.g., 7 dimensions for TLC devices, 15 dimensions for QLC devices) and clustering the points (sets of read thresholds) where the dimensions are not equally important, thus minimizing the number of added errors due to quantization.

In some arrangements, a set of read threshold can be represented as a point in multi-dimensional space where the number of dimension corresponds to the number of thresholds. In some arrangements, a set of read thresholds of each block may be stored in a way that conserve memory on one hand and has minimal performance degradation on the other hand. For example, possible thresholds sets can be clustered in a way that minimizes the number of errors added due to replacement of each thresholds set assigned to a cluster by the central point of that cluster (quantization).

According to certain aspects, arrangements in the present disclosure relate to techniques for a weighted K-means clustering for compressing or quantizing a table of historical read thresholds in NAND storage systems. Read thresholds of each block of a NAND storage system may be stored for later use. In some arrangements, for memory conservation purposes, the thresholds set can be quantized and compressed by (1) training a set of clusters based on added errors due to shift of read thresholds and (2) associating a new thresholds set with one of the trained (or pre-defined) set of clusters. In this manner, the quantization error (e.g., a number of added errors due to quantization) can be minimized. Arrangements in the present disclosure are not limited to a K-means clustering. Other clustering methods, for example, hierarchical clustering, distribution-based clustering, density-based clustering, grid-based clustering, can be used.

In some arrangements, a K-means clustering may use weights for each dimension. The weights may be the number of added errors due to mismatch of each threshold. Each set of read thresholds may be represented as a point in a training set. The training set may include a number of added errors due to shift of each threshold such that these numbers are associated with each point to define the weights of each dimension of that point.

In some arrangements, a clustering process may assign each point to a closest central point such that there is a minimal weighted distance between the point and the central point. A central point of a cluster may be defined as a weighted mean of all points in (or assigned to) the cluster. The central point of a cluster may be accompanied by a set of weights which are calculated from the weights of all points assigned to the cluster. For example, the central point may be a weighted average or mean, or a weighted median, etc.

In some arrangements, a process of associating a new set of read thresholds to a cluster may be performed by calculating a weighted distance from the set of read thresholds (as a new point) to each central point and associating the new point to a cluster where its weighted distance is minimal. The new set of read thresholds may be either operative real-time thresholds set or obtained from a cross-test set. The weighted distance may be calculated using weights accompanying each central point.

In some arrangements, a clustering may be performed on a training set database which stores historical read thresholds. In some arrangements, the clustering may be performed on a large database collected and recorded from many samples from a device (e.g., NAND device) in different conditions. When calculating or obtaining a read thresholds set of a row in a NAND block, it may be stored for future use. Saving a full set of read thresholds for each block generally consumes large memory. For example, in TLC devices it may require storing seven 8-bit numbers for each block, and in QLC devices it may require storing fifteen 8-bit numbers for each block, etc. To address this problem, the storage volume can be decreased significantly by clustering optional values of the read thresholds sets to a pre-defined number of clusters, each cluster having a thresholds set (as a center point) close enough to all sets in that cluster. In this manner, in some arrangements, an optimal set of read thresholds for each block can be stored by (1) using a (history) table storing a set of threshold values for each cluster, and (2) storing or keeping a cluster number for each block. For example, if historical read threshold sets are clustered to 256 clusters, a table of 256 read thresholds sets can be stored, and for each block only an 8-bit single number (such that a cluster number is between 0 to 255) can be stored.

In some arrangements, a flash memory system may include a flash memory and a circuit for performing operations on the flash memory. The circuit may be configured to obtain reference voltages from one or more read samples, and a plurality of sets of reference voltages. The circuit may be configured to obtain a plurality of distances, each being a distance between a point corresponding to the obtained reference voltages and a point corresponding to a respective set of reference voltages. The circuit may be configured to determine a first set of reference voltages such that a distance between the point corresponding to the obtained reference voltages and a point corresponding to the first set of reference voltage is a minimum distance of the plurality of distances. The circuit may be configured to perform read operations on locations of the flash memory with the first set of reference voltages.

In some arrangements, the point corresponding to the respective set of reference voltages may represent a cluster of a plurality of points. The point corresponding to the respective set of reference voltages may be a weighted mean of the plurality of points. The plurality of points may be obtained from a training set database.

In some arrangements, the plurality of sets of reference voltages may be respectively associated with a plurality of sets of weights. Each of the plurality of distances may be a weighted distance between the point corresponding to the obtained reference voltages and the point corresponding to the respective set of reference voltages based on a corresponding set of weights.

In some arrangements, the flash memory system may include a first memory different form the flash memory. The plurality of sets of reference voltages and the plurality of sets of weights may be stored in the first memory.

In some arrangements, in obtaining the plurality of distances, for each of the plurality of sets of reference voltages as a current set of reference voltages wherein the obtained reference voltages and the current set of reference voltages have corresponding reference voltages, the circuit may be configured to calculate a square error between the obtained reference voltages and the current set of reference voltages with respect to each of the corresponding reference voltages. The circuit may be configured to calculate a weighted sum of the square errors of the current set of reference voltages over the corresponding reference voltages based on a set of weights corresponding to the current set of reference voltages. The first set of reference voltages may have a minimum weighted sums of square errors among the plurality of sets of reference voltages. In some arrangements, the minimum weighted sums of square errors may be a minimum square error (MSE).

In some arrangements, in calculating a weighted sum of the square errors of the current set of reference voltages over the corresponding reference voltages, the circuit may be configured to (1) calculate a first weighted sum of square errors of the current set of reference voltages over a first set of the corresponding reference voltages, (2) calculate a second weighted sum of square errors of the current set of reference voltages over a second set of the corresponding reference voltages, and (3) calculate a sum of the first weighted sum of square errors and the second weighted sum of square errors. The circuit may include a first circuit and a second circuit different from the first circuit. The first circuit may be configured to calculate the first weighted sum of square errors of the current set of reference voltages. The second circuit may be configured to calculate the second weighted sum of square errors of the current set of reference voltages.

Arrangements in the present disclosure have at least the following improvements.

First, arrangements in the present disclosure can provide useful techniques for determining the hypotheses for minimizing errors in compression or quantization of read thresholds in NAND flash devices. In some arrangements, sets of read thresholds can be quantized and compressed by (1) training a set of clusters based on added errors due to shift of read thresholds and (2) associating a new thresholds set with one of the trained (or pre-defined) set of clusters. In this manner, the quantization error (e.g., a number of added errors due to quantization) can be minimized.

Second, arrangements in the present disclosure can provide useful techniques for significantly decreasing the storage volume when storing historical read thresholds. In some arrangements, optional values of the read thresholds sets can be clustered into a pre-defined number of clusters, each cluster having a thresholds set (as a center point) close enough to all sets in that cluster. In this manner, an optimal set of read thresholds for each block can be stored by (1) using a (history) table storing a set of threshold values for each cluster, and (2) storing or keeping a cluster number for each block, thus significantly decreasing the storage volume.

Third, arrangements in the present disclosure can provide useful techniques for efficiently obtaining a plurality of distances from a new thresholds set (as a new point) to a plurality of pre-defined or trained clusters. In some embodiments, a circuit can calculate a square error as a distance between the new thresholds set and each of the plurality of clusters over reference voltages using a plurality of registers. For example, a plurality of distances can be calculated by (1) calculating a first weighted sum of square errors of the new thresholds set over a first set of the reference voltages using a first circuit, (2) calculating a second weighted sum of square errors of new thresholds set over a second set of the reference voltages using a second circuit, and (3) calculating a sum of the first weighted sum of square errors and the second weighted sum of square errors. With this hardware configuration, the plurality of distances from the new thresholds set to the plurality of clusters can be efficiently obtained.

Figure 2:
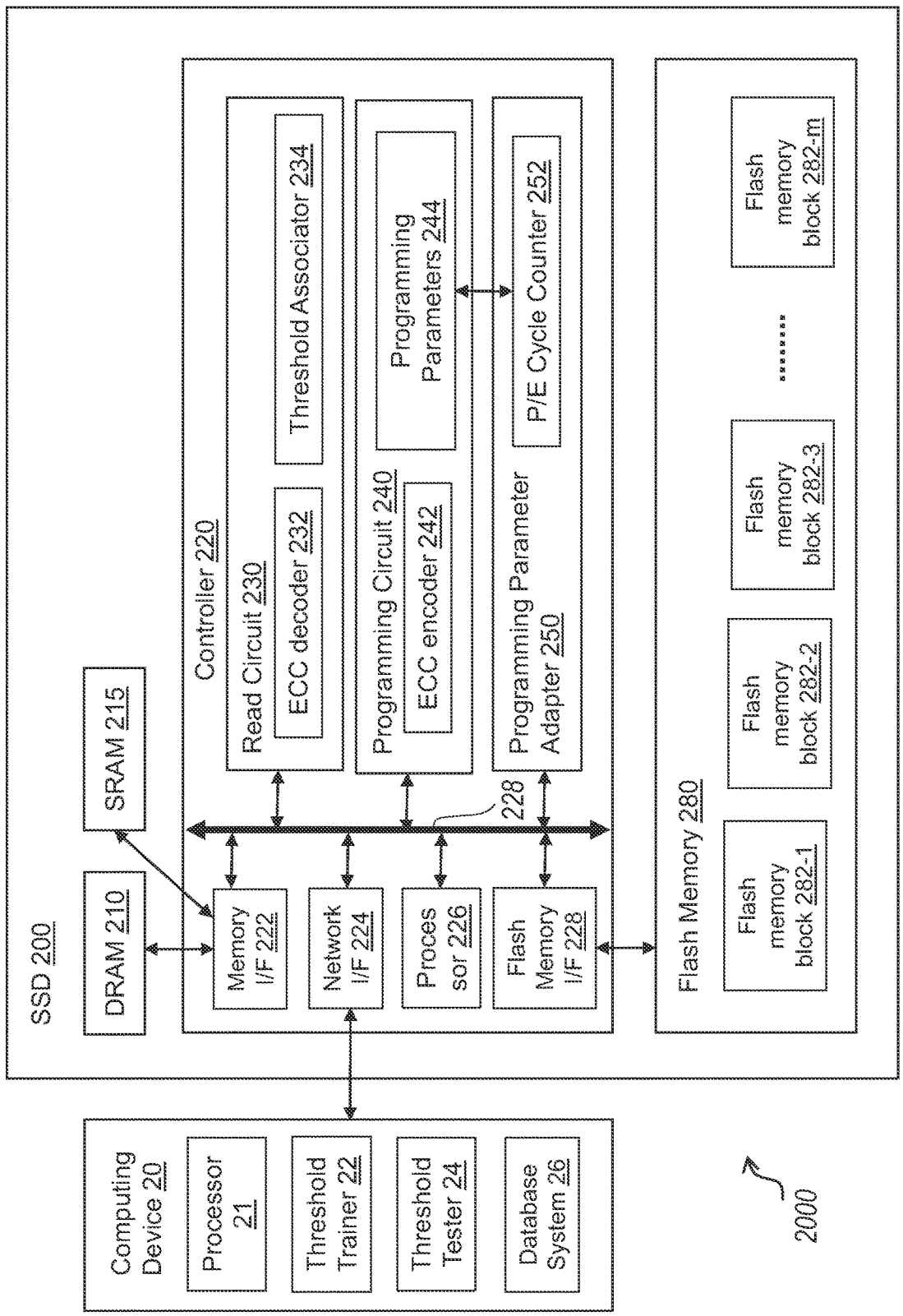
FIG. 2 is a block diagram illustrating an example flash memory system according to some arrangements.

FIG. 2 is a block diagram illustrating an example flash memory system according to some arrangements.

Referring to FIG. 2, a flash memory system 2000 may include a computing device 20 and a solid-state drive (SSD) 200, which is a storage device and may be used as a main storage of an information processing apparatus (e.g., a host computer). The SSD 200 may be incorporated in the information processing apparatus or may be connected to the information processing apparatus via a cable or a network.

The computing device 20 may be an information processing apparatus (computing device). In some arrangements, the computer device 20 which is configured to handle or process data for training and perform a training, is not connected to the SSD 200, and the data for training may be collected from a plurality of SSDs by a plurality of computing devices. The data collected from the plurality of SSDs may be recorded and handled/processed by a different computing device, which is not necessarily connected to any of the SSDs and which performs the training based on the collected data. The computing device 20 includes a processor 21 configured to execute a threshold trainer 22, a threshold tester 24, and/or a database system 26. The database system 26 may store read thresholds values including training sets or results of a clustering process (e.g., K-means clustering process). The threshold trainer 22 may generate a plurality of sets of read thresholds as training results based on the read thresholds stored in the database system 26. The threshold tester 24 may perform cross validating or testing on the training results.

The SSD 200 includes, for example, a controller 220 and a flash memory 280 as non-volatile memory (e.g., a NAND type flash memory). The SSD 200 may include a random access memory which is a volatile memory, for example, DRAM (Dynamic Random Access Memory) 210 and/or SRAM (Static Random Access Memory) 215. The random access memory has, for example, a read buffer which is a buffer area for temporarily storing data read out from the flash memory 280, a write buffer which is a buffer area for temporarily storing data written in the flash memory 280, and a buffer used for a garbage collection. In some arrangements, the controller 220 may include DRAM or SRAM.

In some arrangements, the flash memory 280 may include a memory cell array which includes a plurality of flash memory blocks (e.g., NAND blocks) 282-1 to 282-$m$. Each of the blocks 282-1 to 282-$m$ may function as an erase unit. Each of the blocks 282-1 to 282-$m$ includes a plurality of physical pages. In some arrangements, in the flash memory 280, data reading and data writing are executed on a page basis, and data erasing is executed on a block basis.

In some arrangements, the controller 220 may be a memory controller configured to control the flash memory 280. The controller 220 includes, for example, a processor (e.g., CPU) 226, a flash memory interface 228, and a memory interface 222, a network interface 224, all of which may be interconnected via a bus 228. The memory interface 222 may include a DRAM controller configured to control an access to the DRAM 210, and a SRAM controller configured to control an access to the SRAM 215. The flash memory interface 228 may function as a flash memory control circuit (e.g., NAND control circuit) configured to control the flash memory 280 (e.g., NAND type flash memory). The network interface 224 may function as a circuit which receives various data from the computing device 20 and transmits data to the computing device 20. The data may include a plurality of sets of read thresholds as training results generated by the threshold trainer 22. The threshold trainer 22 may perform a training using data collected from a plurality of SSDs by a plurality of computing devices (which may be different from computing device 20).

The controller 220 may include a read circuit 230, a programming circuit (e.g. a program DSP) 240, and a programming parameter adapter 250. As shown in FIG. 2, the adapter 250 can adapt the programming parameters 244 used by programming circuit 240 as described above. The adapter 250 in this example may include a Program/Erase (P/E) cycle counter 252. Although shown separately for ease of illustration, some or all of the adapter 250 can be incorporated in the programming circuit 240. In some arrangements, the read circuit 230 may include an ECC decoder 232 and a threshold associator 234. The threshold associator 234 may associate (new) sample read thresholds with a set of read thresholds from among a plurality of sets of read thresholds as training results generated by the threshold trainer 22. In some arrangements, the programming circuit 240 may include an ECC encoder 242. Arrangements of memory controller 220 can include additional or fewer components such as those shown in FIG. 2.

Figure 3:
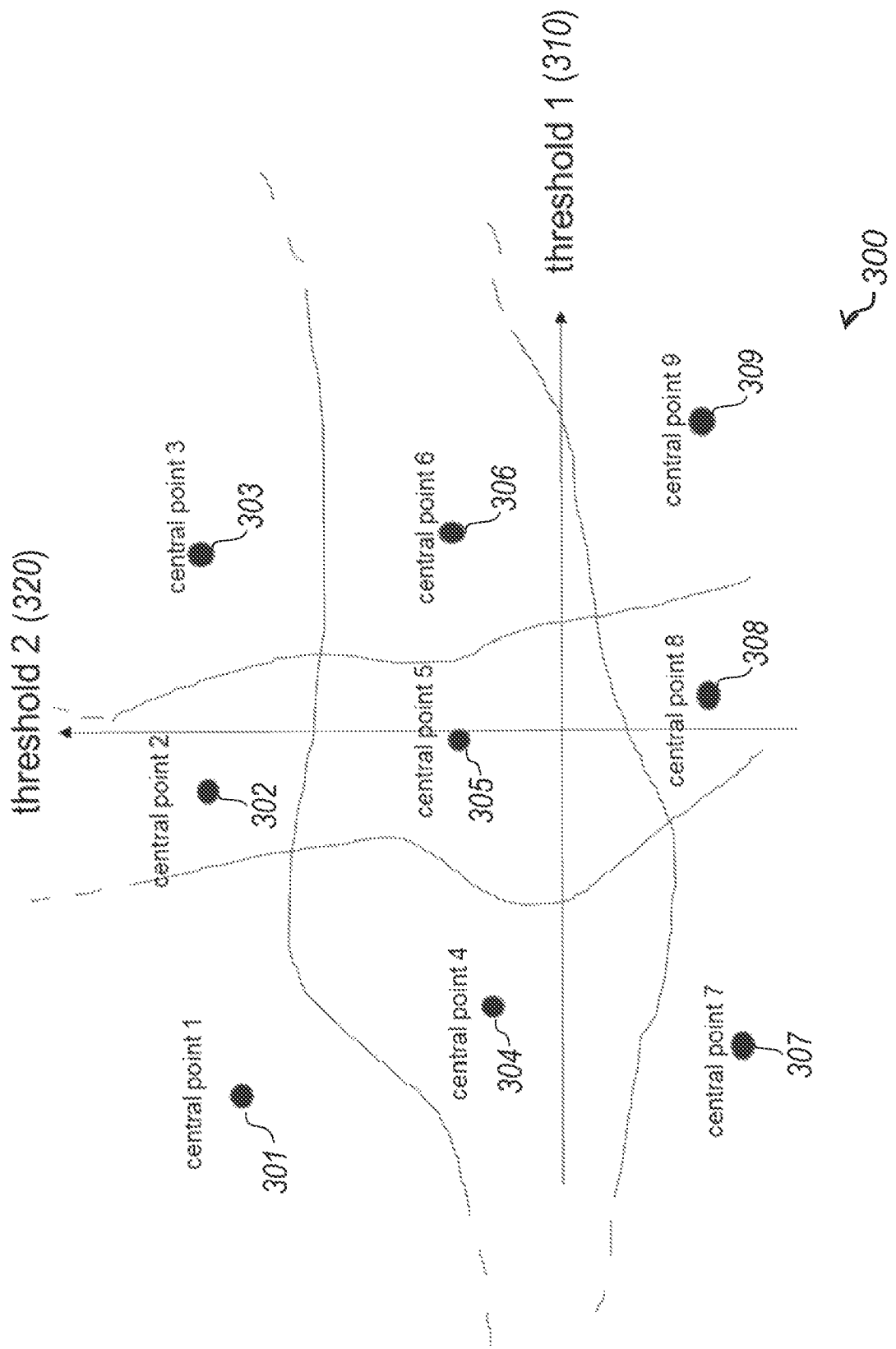
FIG. 3 is a diagram illustrating an example result of clustering two-dimensional read thresholds according to some arrangements.

FIG. 3 is a diagram illustrating an example result of clustering two-dimensional read thresholds according to some arrangements.

In some arrangements, each read thresholds set may be represented as a point in an n-dimensional space. For example, each read thresholds set may be defined in a 7-dimensional space in TLC devices, or in a 15-dimensional space in QLC devices, etc. In some arrangements, the space may be split or divided to clusters with definite borders between them, and each cluster has a central point (or decision point) which represents a set of read thresholds. Every set of thresholds can be associated to a cluster, and a value representing the cluster number (or an identifier of the associated cluster) can be stored for later use. When a new thresholds set is inputted, the new thresholds set can be associated to a cluster and be replaced by the central point of the associated cluster. In this manner, the whole space can be quantized to a predefined number of thresholds sets.

FIG. 3 shows an example result 300 of clustering two-dimensional read thresholds. Read thresholds sets are represented as a point in a 2-dimensional space defined with first thresholds 310 and second thresholds 320. The 2-dimensional space is split or divided to nine clusters having respective central points 301, 302, 303, 304, 305, 306, 307, 308, 309. With these clusters, when a new thresholds set is inputted, the new thresholds set can be associated to one of the nine clusters and be replaced by the central point of the associated cluster. In this manner, the whole 2-dimensional space can be quantized to a predefined number (e.g., nine) of thresholds sets.

In some arrangements, a K-means clustering may be used for clustering read thresholds sets. Generally, K-means clustering is an efficient technique for clustering, which splits a given training set to a predetermined number of clusters and defines a central point to each cluster so the sum of square distances between the training set points to the central points of their corresponding clusters is minimal. In some cases, quantization errors (e.g., added BER) may occur since the read thresholds set stored is not exactly the thresholds set calculated, but the one corresponding to the cluster to which the thresholds set is associated. Because added BER depends differently on each threshold (each dimension of the space), an ordinary K-means clustering which gives equal weight to all dimensions, may not be able to sufficiently minimize the quantization errors. In some arrangements, a clustering algorithm may be performed using weights corresponding the number of added errors due to mismatch of each threshold, thus minimizing the added BER due to quantization. For example, a weighted K-means clustering may be used for clustering read thresholds sets.

In some arrangements, a weighted K-means clustering may split (or cluster or divide or classify) a given training set into a predetermined number of clusters and define (or calculate) a central point to each cluster so that a sum of distances (e.g., a sum of weighted square distances) between the training set points to the central points of their corresponding clusters is minimal. The weights of each point (e.g., a set of read thresholds) may be a set of measured added BER due to a constant shift in a value of each read threshold. In this manner, this clustering technique can approximately minimize the added BER due to quantization. The clustering technique may only approximately minimize added BER because the added BER is not linearly dependent on thresholds shifts.

In some arrangements, a weighted clustering process (e.g., weighted K-means clustering) may be performed in two parts: (1) training process which may be performed offline by a computing device (e.g., threshold trainer 22 of computing device 20 in FIG. 2); and (2) association process which may be performed online in real time by a NAND device (e.g., threshold associator 234 of SSD 200 in FIG. 2). In some arrangements, the training process may cluster a training set of points (e.g., read thresholds) into a plurality of clusters and define or calculate a central point and weights of each cluster. The association process may obtain (or receive or calculate) a new set of read thresholds as a new point, calculate a weighted distance from the new point to each cluster, and decide (or determine or identify) to which cluster the new point should be associated or assigned.

Figure 4:
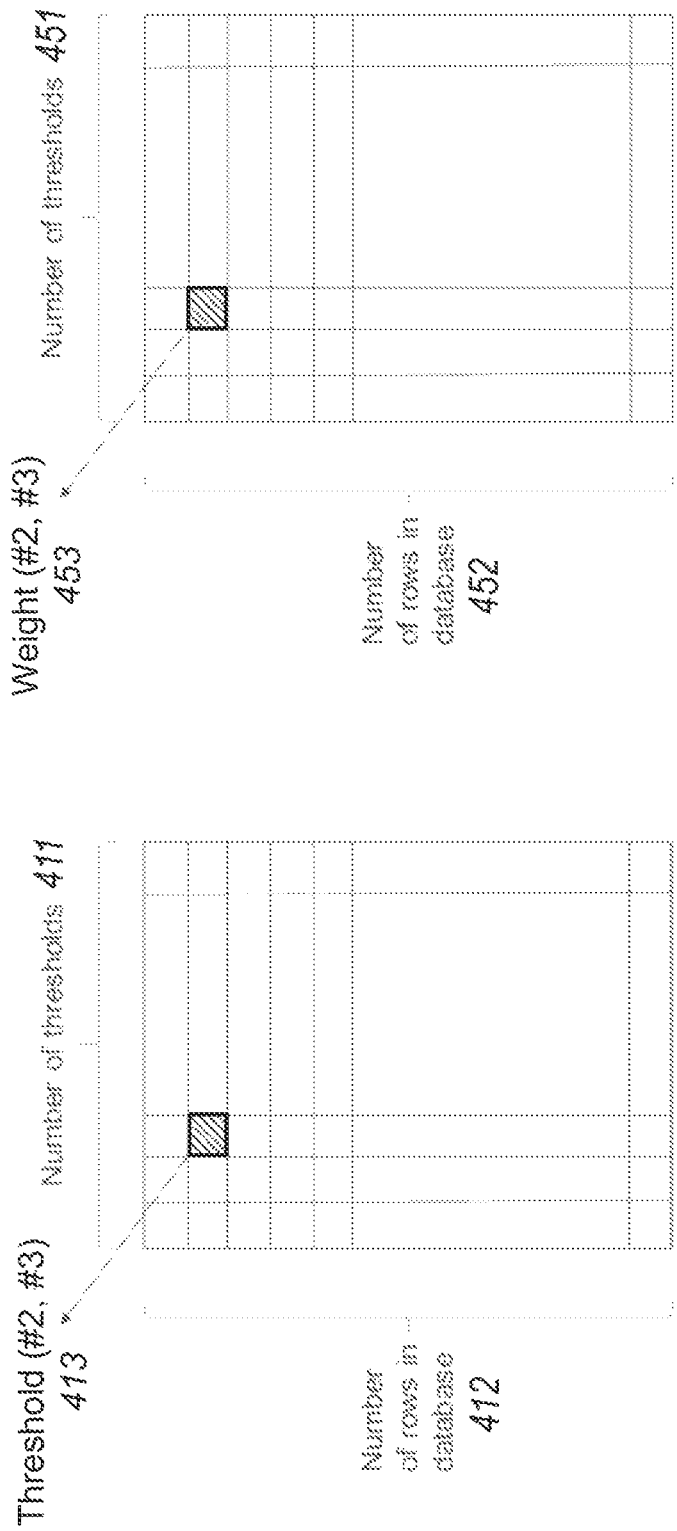
FIG. 4A and FIG. 4B are diagrams illustrating example tables storing a training set for a clustering process according to some arrangements.

In some arrangements, a weighted K-means clustering may be used as a training process for clustering read thresholds sets in a training set. In some arrangements, a training set of read thresholds may be stored in one or more tables which may be stored in a database system (e.g., database system 26 of computing device 20 in FIG. 2). FIG. 4A and FIG. 4B are diagrams illustrating example tables storing a training set for a clustering process according to some arrangements.

Referring to FIG. 4A and FIG. 4B, a training set may include a thresholds table 410 of read thresholds sets and a weights table 450 of corresponding weights. In some arrangements, the weights may be added BER (e.g., number of added errors) due to a specific shift from each threshold. In some arrangements, added BER may be calculated in the following manner. Each row of a NAND device may be programed with pseudo-random pre-defined data, and scanned with a full-voltage scan thereby obtaining a high resolution histogram. A database (e.g., database system 26 in FIG. 2) may contain (store or record) (1) optimal thresholds, (2) weights (which are actually added BER due to a specific pre-defined deviation from optimal thresholds) and (3) the high resolution histograms of all the rows. When reading the recorded histogram with the optimal thresholds, the data read with the optimal threshold may be compared to the pre-defined data, and an optimal BER may be calculated based on a result of the comparison. When reading with a different thresholds set, the data read with the different threshold set may be compared to the pre-defined data, and a different BER may be calculated based on a result of the comparison. The added BER may be calculated as a difference between the optical BER and the different BER.

The thresholds table 410 has (1) a plurality of columns 411 corresponding to dimensions (different thresholds) of a clustering space (e.g., 7 columns for TLC devices, 15 columns for QLC devices etc.), and (2) a plurality of rows 412 corresponding to a plurality of read thresholds sets (or a plurality of points to be clustered). The thresholds table 410 stores a plurality of read threshold sets having a pre-determined dimensions. For example, a (2, 3) element of thresholds table 410 (which is an element at $2^{nd}$ row and $3^{rd}$ column) indicates a voltage of the $3^{rd}$ threshold in the $2^{nd}$ read threshold set.

Similarly, the weights table 450 has (1) a plurality of columns 451 corresponding to dimensions (different thresholds) of a clustering space (e.g., 7 columns for TLC devices, 15 columns for QLC devices etc.), and (2) a plurality of rows 452 corresponding to a plurality of weights sets (or a plurality of points to be clustered). Here, a weight may indicate an added number of errors (e.g., BER) due to shifts in threshold values. The weights table 450 stores a plurality of weights having a predetermined dimensions. For example, a (2, 3) element of weights table 450 (which is an element at $2^{nd}$ row and $3^{rd}$ column) indicates a BER value of the $3^{rd}$ threshold in the $2^{nd}$ weights set.

Figure 5:
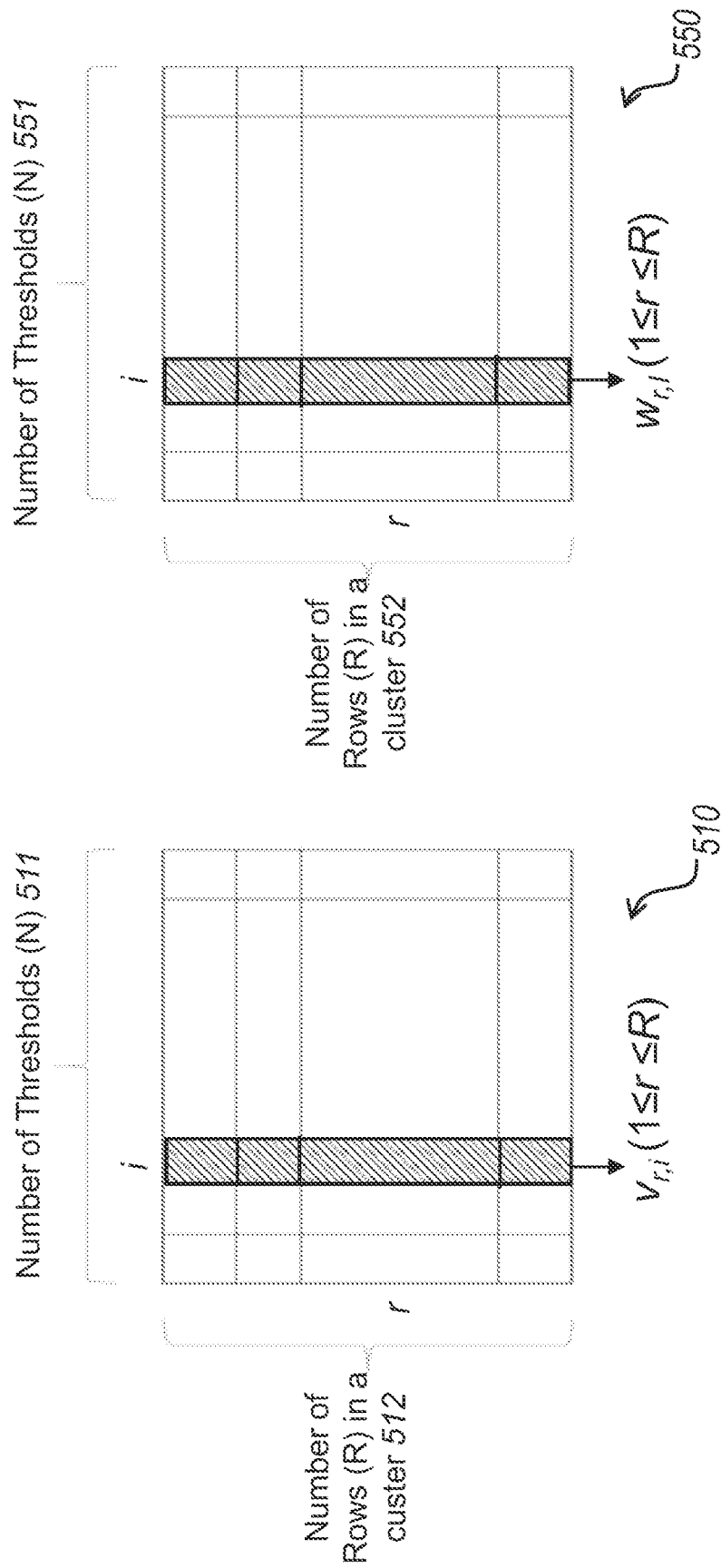
FIG. 5A and FIG. 5B are diagrams illustrating example tables storing data for training a clustering process according to some arrangements.

FIG. 5A and FIG. 5B are diagrams illustrating example tables storing data for training a clustering process according to some arrangements.

Referring to FIG. 5A, a per-cluster thresholds table 510 has (1) a plurality of columns 511 corresponding to N dimensions (different thresholds) of a clustering space (e.g., 7 columns for TLC devices, 15 columns for QLC devices etc.), and (2) a plurality of rows 512 corresponding to R read thresholds sets in a single cluster. The per-cluster thresholds table 510 stores R read thresholds sets having N dimensions in the same cluster. For example, the $i^{th}$ column in the per-cluster thresholds table 510, denoted by $v_{r,i}$ (1≤r≤R), indicates R voltage values of $i^{th}$ threshold.

Similarly, referring to FIG. 5B, a per-cluster weights table 550 has (1) a plurality of columns 551 corresponding to N dimensions (different thresholds) of a clustering space (e.g., 7 columns for TLC devices, 15 columns for QLC devices etc.), and (2) a plurality of rows 552 corresponding to R weights sets in a single cluster. Here, a weight may indicate an added number of errors (e.g., BER) due to shifts in threshold values. The per-cluster weights table 550 stores R weights having N dimensions. For example, the $i^{th}$ column in the per-cluster weights table 550, denoted by $w_{r,i}$ (1≤r≤R), indicates R weights of $i^{th}$ threshold.

Figure 6:
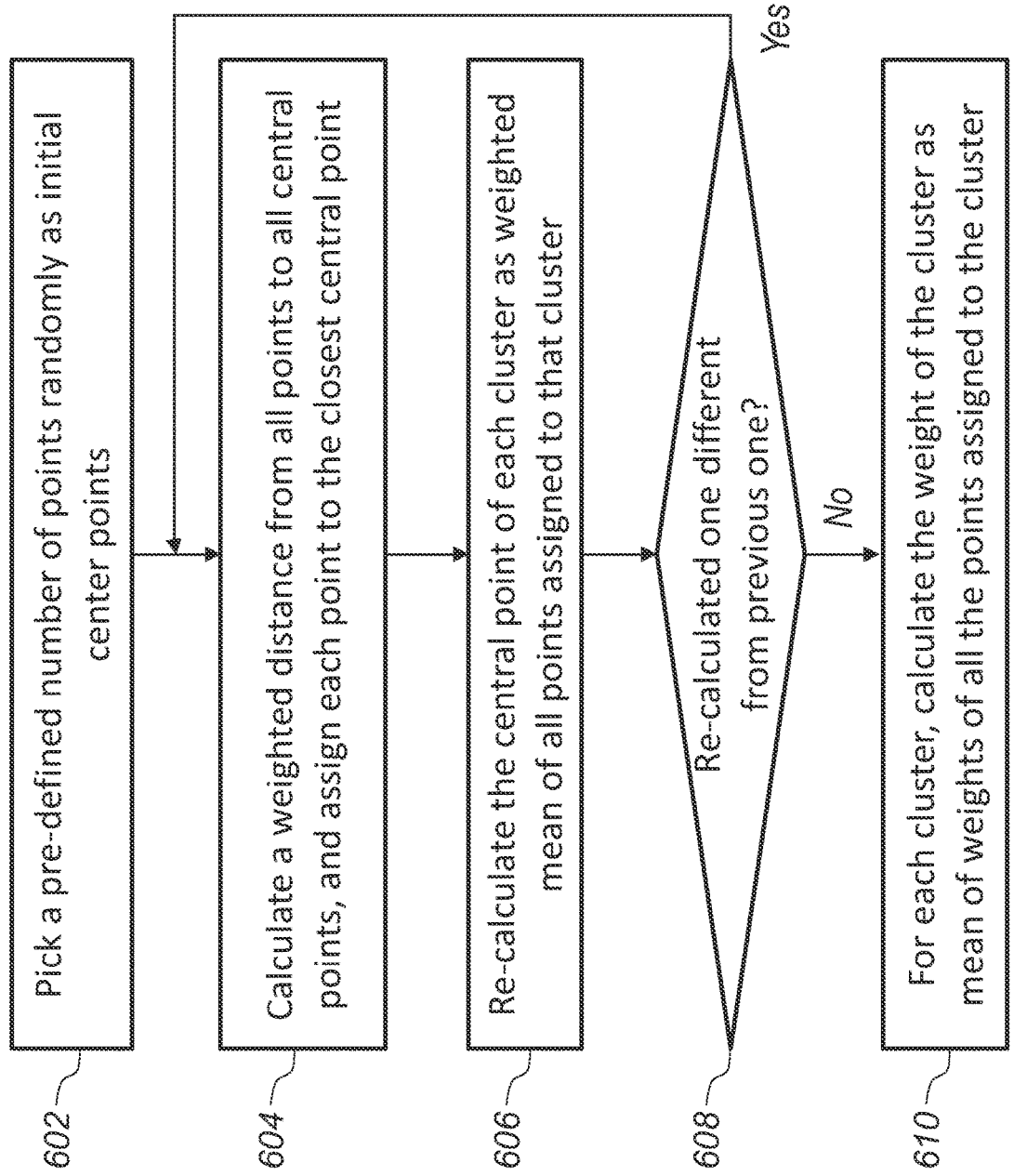
FIG. 6 is a flowchart illustrating an example methodology for training a clustering process according to some arrangements.

FIG. 6 is a flowchart illustrating an example methodology for training a clustering process according to some arrangements.

In some arrangements, the example methodology relates to a training process 600 for training a plurality of clusters using a training set (e.g., training set stored in tables 410, 450 in FIGS. 4A and 4B). In some arrangements, the training process 600 may be performed offline by a computing device (e.g., threshold trainer 22 of computing device 20 in FIG. 2).

In this example, the process 600 begins in S602 by picking or determining, by a computing device (e.g., threshold trainer 22 of computing device 20 in FIG. 2), a pre-defined number of points as initial center points. In some arrangements, the training process 600 may randomly choose or pick the pre-determined number of points as temporary central points.

In S604, in some arrangements, the computing device may calculate a weighted distance from all points to all central points, and assign each point to a closest central point. In some arrangements, the computing device may assign all points to the temporary central points based on minimal weighted distances. In some arrangements, a weighted distance WD between (1) a point represented by a vector $\bar{v}$ ($\bar{v}=(v_1, v_2, \ldots, v_N)$) of optimal read thresholds (e.g., vector defined by a specific row in the thresholds table 410 in FIG. 4A) and (2) a central point represented by a vector $\bar{u}$ ($\bar{u}=(u_1, u_2, \ldots, u_N)$) may be defined as follows:

$$WD(\bar{v},\bar{u}) = \sqrt{\sum_{i=1}^{N} w_i^p (u_i - v_i)^2}, \quad \text{(Equation 1)}$$

where $w_i$ is a weight corresponding to $i^{th}$ threshold (e.g., weight defined by $i^{th}$ column in the weights table 450 in FIG. 4B), $v_i$ is a voltage value corresponding to $i^{th}$ threshold (e.g., voltage value defined by $i^{th}$ column in the thresholds table 410 in FIG. 4A), N is the number of dimensions (e.g., N=7 for TLC devices, N=15 for QLC devices etc.), and p is the power of the weights. When p=0, the distance will become un-weighted distance as in ordinary K-means. When p>1, as p increases, the weights will become more emphasized. Experimental results showed that p=1 gives best performance in terms of minimizing BER loss. In some arrangements, the computing device may calculate a weighted distance between each point and a central point of each cluster using Equation 1, and assign each point to a cluster such that the weighted distance to the central point of that cluster is a minimal weighted distance.

In S606, in some arrangements, the computing device may re-calculate the central point of each cluster as a weighted mean of all points assigned to that cluster. In some arrangements, the central point $\bar{u}$ of a cluster ($\bar{u}=(u_1, u_2, \ldots, u_N)$) as a weighted mean of all the points assigned to the cluster may be defined as follows:

$$u_i = \frac{\sum_{r=1}^{R} v_{r,i} \cdot w_{r,i}^p}{\sum_{r=1}^{R} w_{r,i}^p}, \quad \text{(Equation 2)}$$

where R is the number of points (read thresholds sets) in the cluster (e.g., number of rows in the per-cluster thresholds table 510 in FIG. 5A), N is the number of dimensions (e.g., N=7 for TLC devices, N=15 for QLC devices etc.), $v_{r,i}$ (1≤r≤R) indicates R voltage values of $i^{th}$ threshold (e.g., $i^{th}$ column of the per-cluster thresholds table 510 in FIG. 5A), $w_{r,i}$ (1≤r≤R) indicates R weights of $i^{th}$ threshold (e.g., $i^{th}$ column of the per-cluster weights table 550 in FIG. 5B), and p is the power of the weights.

In some arrangements, the training process 600 may repeat assigning the points to new central points and re-calculating central points until no further change in clusters (S604 to S608). In S608, in some arrangements, the computing device may determine whether the re-calculated central point is different from the previous central point. If it is determined that the re-calculated central point is different from the previous central point, the computing device may proceed to S604. If it is determined that the re-calculated central point is not different from the previous central point, the computing device may proceed to S610.

In S610, in some arrangements, for each cluster, the computing device may calculate a weight vector of the cluster as a mean of the weights of all the points assigned to the cluster. In some arrangements, the weight vector of the cluster $\overline{CW}$ of a cluster ($\overline{CW}=(CW_1, CW_2, \ldots, CW_N)$) as a mean of weights of all the points assigned to the cluster may be defined as follows:

$$CW_i = \frac{\sum_{r=1}^{R} w_{r,i}}{R}, \quad \text{(Equation 3)}$$

where R is the number of points (read thresholds sets) in the cluster (e.g., number of rows in the per-cluster weights table 550 in FIG. 5B), N is the number of dimensions (e.g., N=7 for TLC devices, N=15 for QLC devices etc.), and $w_{r,i}$ ($1 \leq r \leq R$) indicates R weights of $i^{th}$ threshold in the cluster (e.g., $i^{th}$ column of the per-cluster weights table 550 in FIG. 5B).

In some arrangements, the weight vector of the cluster $\overline{CW}$ of a cluster ($\overline{CW}=(CW_1, CW_2, \ldots, CW_N)$) as a median of weights of all the points assigned to the cluster may be defined as follows:

$$CW_i = \text{median}(w_i) \quad \text{(Equation 4)},$$

where R is the number of points in the cluster, N is the number of dimensions, and $w_i$ indicates all the weights of $i^{th}$ threshold in the cluster (e.g., $i^{th}$ column of the per-cluster weights table 550 in FIG. 5B).

Figures 8A, 8B:
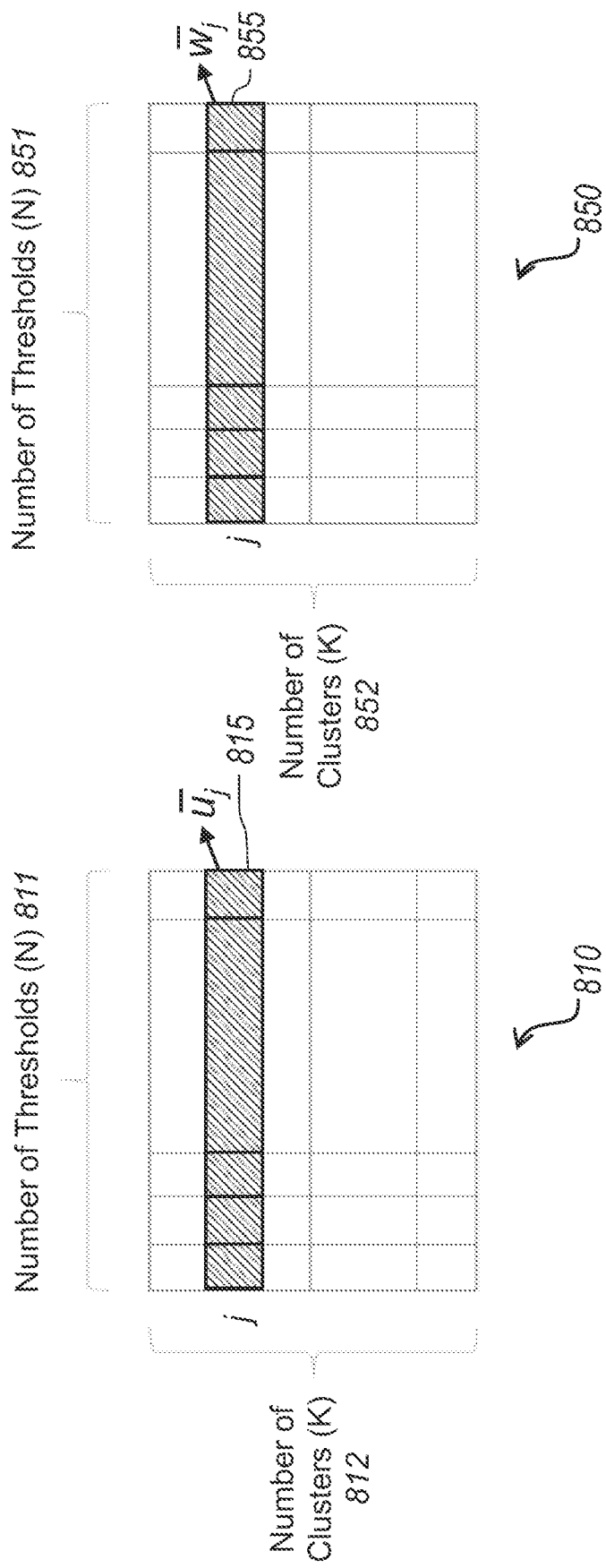
FIG. 8A and FIG. 8B are diagrams illustrating example tables for associating input data with a cluster according to some arrangements.

In some arrangements, a result or product of the training process 600 may include (1) a set of central points (e.g., table 810 in FIG. 8A) and (2) a set of weights corresponding to the set of central points (e.g., table 850 in FIG. 8B).

Figure 7A:
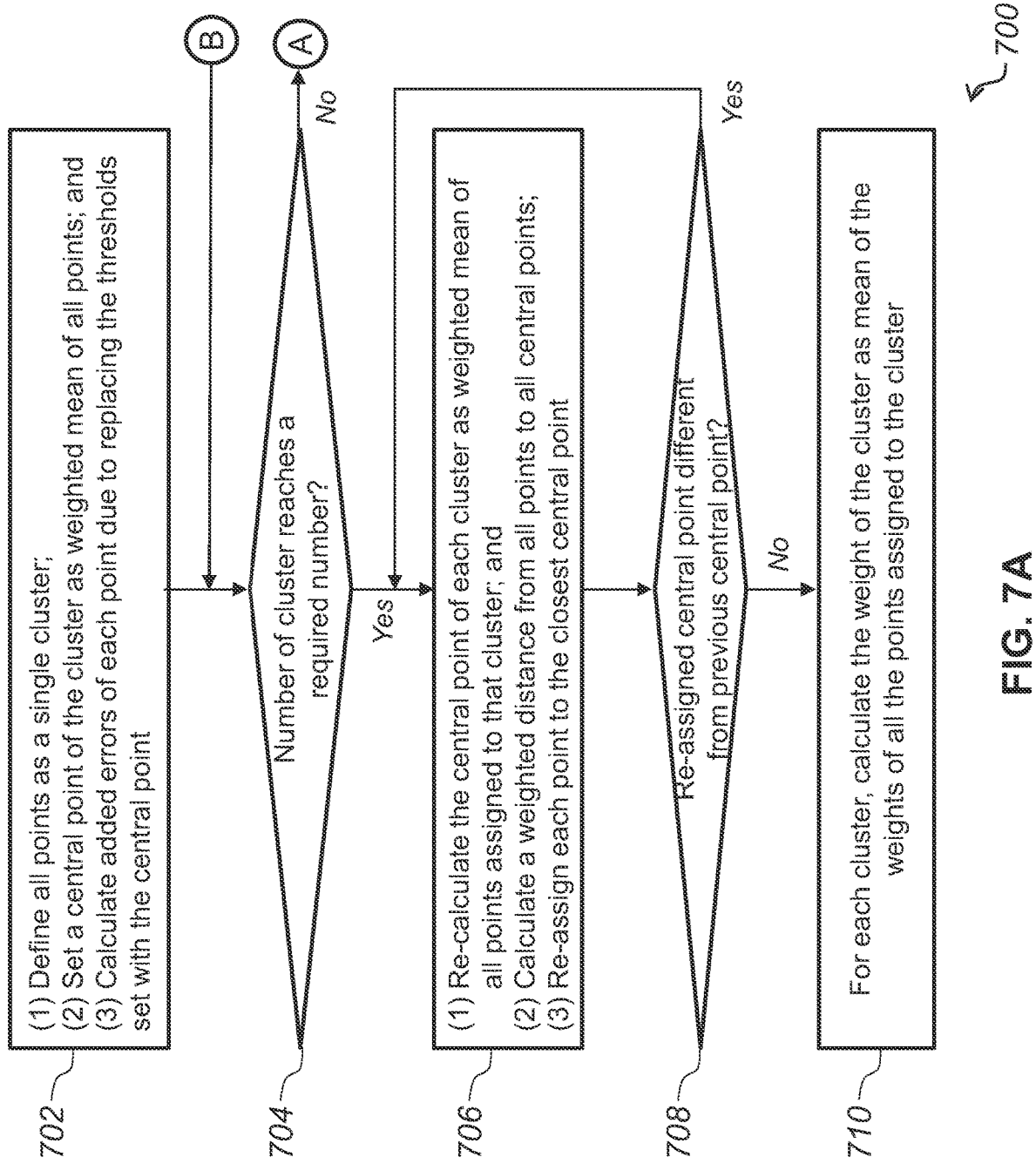
FIG. 7A and FIG. 7B are a flowchart illustrating another example methodology for training a clustering process according to some arrangements.
Figure 7B:
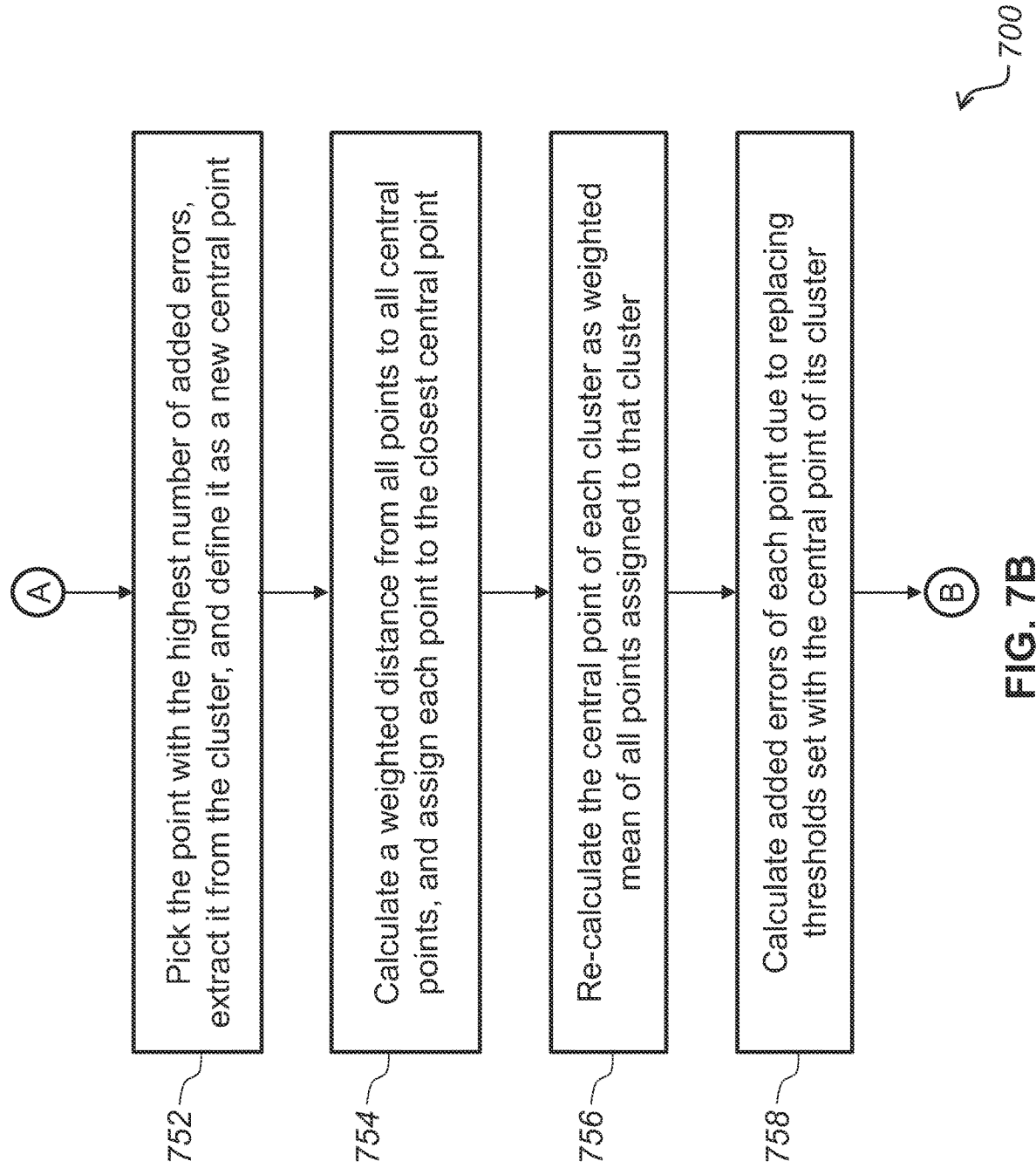

FIG. 7A and FIG. 7B are a flowchart illustrating another example methodology for training a clustering process according to some arrangements.

In some arrangements, the example methodology relates to a training process 700 for training a plurality of clusters using a training set (e.g., training set stored in tables 410, 450 in FIGS. 4A and 4B). In some arrangements, the training process 700 may be performed offline by a computing device (e.g., threshold trainer 22 of computing device 20 in FIG. 2).

In this example, the process 700 begins in S702 by (1) defining all points as a single cluster, (2) setting or calculating a central point of the cluster as weighted mean of all points, and (3) calculating added errors (e.g., added BER) of each point due to replacing the thresholds set with the central point. In some arrangements, the weights are not changing during a training process. The weights may be calculated when building the database, as added BER (e.g., number of added errors) due to a specific pre-defined deviation from optimal thresholds. The added BER calculation in S702 and S758 may define the cost of the clustering process at the end of an iteration, so that the next iteration is performed based on the defined cost of the clustering process. In some arrangements, a computing device (e.g., computing device 20) may calculate the central point of the cluster as a weighted mean of all the points using Equation 2.

In S704, in some arrangements, a computing device may determine whether the number of cluster reaches a required number (e.g., 255). If it is determined that the number of cluster reaches the required number, the computing device may proceed to S706. If it is determined that the number of cluster does not reach the required number, the computing device may proceed to S752.

In S752, in some arrangements, the computing device may pick (or choose or select) a point with the highest number of added errors, extract that point from its cluster, and define that point as a new central point. For example, in each iteration of the training process the number of clusters may increase by 1. The computing device may pick a single point with highest added BER in the whole database, extract the single point from its cluster (because being assigned to its cluster would result in the highest cost of the whole database), and define the single point as a temporary central point of a new cluster to which other points may be assigned later on in the iteration.

In S754, in some arrangements, the computing device may calculate a weighted distance from all points to all central points, and assign each point to the closest central point. For example, when the number of clusters is only one and there is only a first central point of the single cluster, the computing device may pick a point with the highest added BER and add the point as a second central point, and re-assign all points to the new two central points (having now two clusters).

In S756, in some arrangements, the computing device may re-calculate the central point of each cluster as weighted mean of all points assigned to that cluster. In S758, in some arrangements, the computing device may calculate added errors of each point due to replacing thresholds set with the central point of its cluster, and proceed to S704. For example, the computing device may re-calculate the central point of each cluster as a weighted mean of the points assigned to that cluster using Equation 2, and calculate the true added BER of each point due to its replacement by its corresponding central point. The computing device may repeat S752 to S758 (e.g., picking the highest added BER point as a new central point, and re-assigning points and re-calculating central points) until arriving at the required number of clusters (e.g., 255). From then on, the computing device may continue re-assigning points and re-calculating central points as illustrated in FIG. 6 until no further change in clusters (S706 to S710) as described in the following section.

In S706, in some arrangements, the computing device may re-calculate the central point of each cluster as weighted mean of all points assigned to that cluster. In some arrangements, the computing device may calculate the central point of each cluster as a weighted mean of all the points assigned to the cluster using Equation 2. The computing device may calculate a weighted distance from all points to all central points. The computing device may re-assign each point to a closest central point. In some arrangements, the computing device may calculate a weighted distance between each point and a central point of each cluster using Equation 1, and assign each point to a cluster such that the weighted distance to that cluster is a minimal weighted distance.

In S708, in some arrangements, the computing device may determine whether the re-calculated central point is different from the previous central point. If it is determined that the re-calculated central point is different from the previous central point, the computing device may proceed to S706. If it is determined that the re-calculated central point is not different from the previous central point, the computing device may proceed to S710.

In S710, in some arrangements, for each cluster, the computing device may calculate the weight of the cluster (1)

as a mean of the weights of all the points assigned to the cluster using Equation 3 or (2) as a median of the weights of all the points assigned to the cluster using Equation 4.

In some arrangements, a result or product of the training process 700 may include (1) a set of central points (e.g., table 810 in FIG. 8A) and (2) a set of weights corresponding to the set of central points (e.g., table 850 in FIG. 8B).

FIG. 8A and FIG. 8B are diagrams illustrating example tables for associating input data with a cluster according to some arrangements.

Referring to FIG. 8A, a central points table 810 has (1) a plurality of columns 811 corresponding to N dimensions (different thresholds) of a clustering space (e.g., 7 columns for TLC devices, 15 columns for QLC devices etc.), and (2) a plurality of rows 812 corresponding to K central points of K clusters. The central points table 810 stores K central points having N dimensions as a result of a training process (e.g., training process 600 in FIG. 6 or training process 700 in FIG. 7A and FIG. 7B). For example, the $j^{th}$ row 815 in the central points table 810, denoted by $\overline{u}_j$, indicates the central point of $j^{th}$ cluster.

Referring to FIG. 8B, a weight vectors table 850 has (1) a plurality of columns 851 corresponding to N dimensions (different thresholds) of a clustering space (e.g., 7 columns for TLC devices, 15 columns for QLC devices etc.), and (2) a plurality of rows 852 corresponding to K weight vectors of K clusters. The weights table 850 stores K weight vectors having N dimensions as a result of a training process (e.g., training process 600 in FIG. 6 or training process 700 in FIG. 7A and FIG. 7B). For example, the $j^{th}$ row 855 in the weight vectors table 850, denoted by $\overline{w}_j$, indicates the weight vector of $j^{th}$ cluster.

Figure 9:
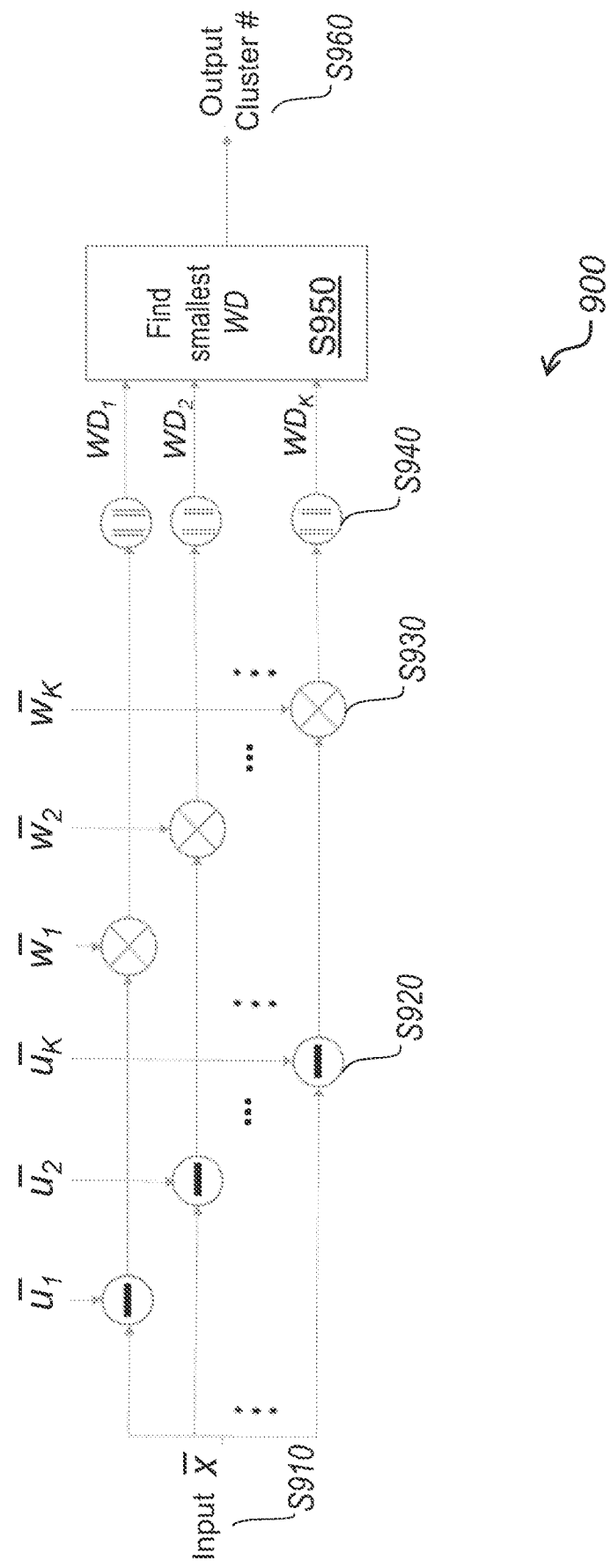
FIG. 9 is a diagram illustrating an example process of associating input data with a cluster according to some arrangements.

FIG. 9 is a diagram illustrating an example association process 900 of associating an input point $\overline{x}$ (e.g., set of read thresholds) with one of a plurality of clusters (e.g., K clusters generated as a result of a training process) according to some arrangements. In some arrangements, the association process 900 may be performed online in real time by a NAND device (e.g., controller 220, read circuit 230, threshold associator 234 of SSD 200 in FIG. 2). In some arrangements, the association process 900 may be performed using a result or product of a training process, including (1) a set of central points (e.g., table 810 in FIG. 8A) and (2) a set of weights corresponding to the set of central points (e.g., table 850 in FIG. 8B).

The association process 900 may receive the input point $\overline{X}$ (S910), calculate weighted distances (WD$_1$, WD$_2$, . . . , WD$_K$) from the input point $\overline{X}$ to all central points of all clusters ($\overline{u}_1$, $\overline{u}_2$, . . . , $\overline{u}_K$) based on weight vectors ($\overline{w}_1$, $\overline{w}_2$, . . . , $\overline{w}_K$) of all the clusters. In some arrangements, the association process 900 may calculate a weighted distance between the input point $\overline{X}$ and a central point of each cluster using Equation 1. Calculation of weighted distances using Equation 1 may include a difference operation (S920), a multiplication operation (S930), and a calculation of norm-2 distance (S940). The association process 900 may find or identify a smallest WD$_i$ among WD$_1$, WD$_2$, . . . , WD$_K$ (S950). The association process 900 may associate input point $\overline{X}$ (e.g., set of read thresholds calculated based on a particular block) to the $i^{th}$ cluster with the minimal (smallest) weighted distance, and output the cluster number i (sS60). The NAND device may be configured to perform read operations on the particular block of the flash memory with a set of read thresholds corresponding to the central point of the $i^{th}$ cluster.

The association process 900 may attach (or assign or associate) an input point to one of a plurality of trained clusters in real time operative mode. For example, the input point may be a set of read thresholds calculated or obtained online in real time by a flash memory system (e.g., controller 220, read circuit 230, threshold associator 234 of SSD 200 in FIG. 2). In some arrangements, the association process 900 may input a point from cross validation set or test set when cross validating or testing the training results. One difference between an association process (e.g., association process 900 in FIG. 9) and a training process (e.g., training process 600 in FIG. 6 and training process 700 in FIGS. 7A and 7B) is that weights used in the training process are per point while in weights used in the association process are per central points of the clusters.

As a result of the association process, a cluster number (e.g., an 8-bit single number) corresponding to each block can be stored for future use, thus significantly decreasing the storage volume compared to saving all historical sets of read thresholds for each block.

Figure 10:
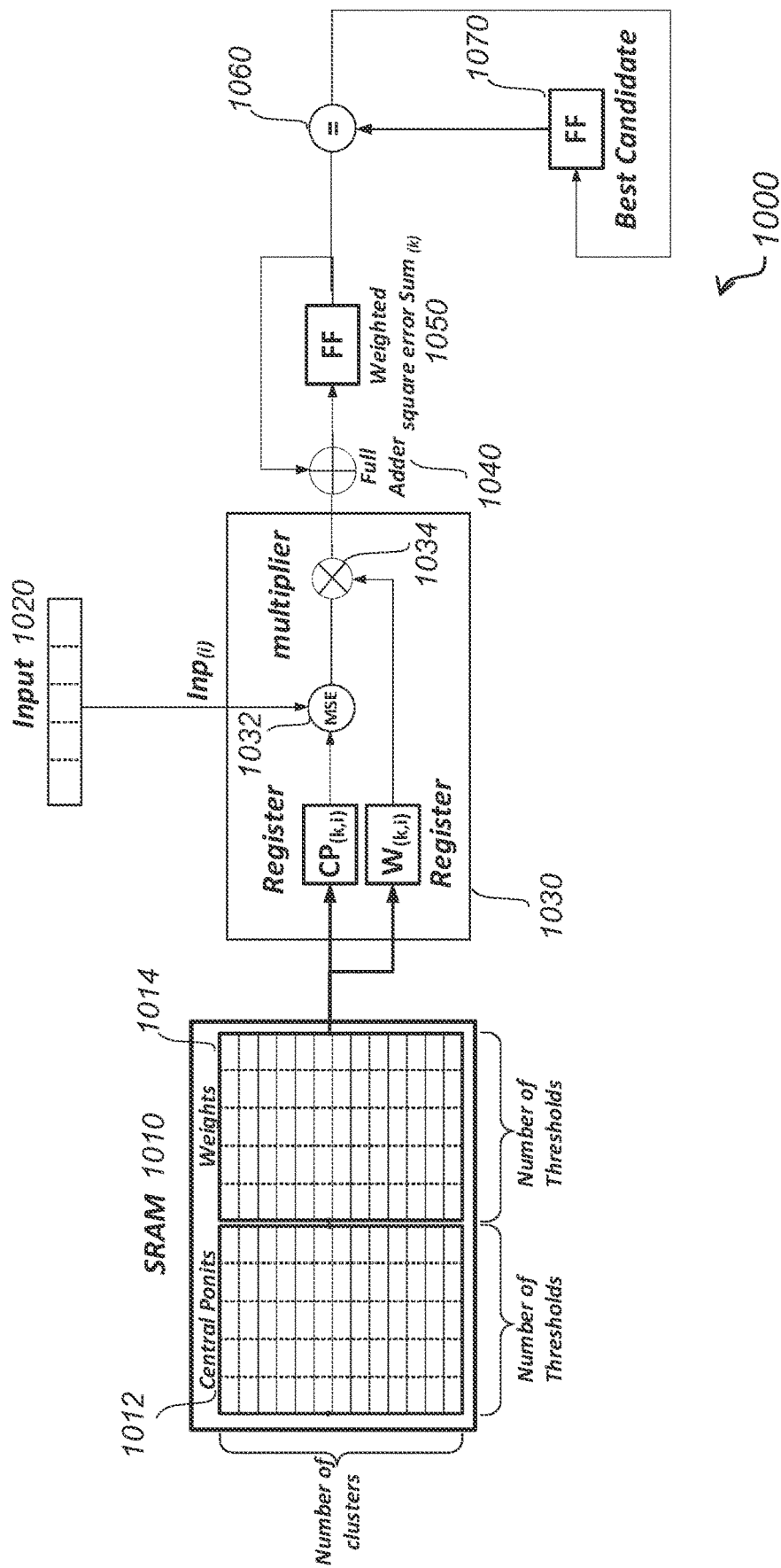
FIG. 10 is a diagram illustrating an example structure for associating input data with a cluster according to some arrangements.

FIG. 10 is a diagram illustrating an example structure for associating input data with a cluster according to some arrangements. In some arrangements, an association process (e.g., process 900 in FIG. 9) may be implemented in an example hardware structure 1000 shown in FIG. 10. In some arrangements, the hardware structure 1000 may be included in a NAND device (e.g., controller 220, read circuit 230, threshold associator 234 of SSD 200 in FIG. 2).

In some arrangements, a clustering (e.g., weighted K-means clustering) as a training process (e.g., process 600 in FIG. 6 and process 700 in FIG. 7) may be performed offline, and a result of the clustering may be K central points that represent the N-dimension space (e.g., central points table 810 in FIG. 8A). In some arrangements, an association process may be performed online for a new input (e.g., a set of read thresholds calculated or obtained online in real time by a flash memory system), and associate the new input (e.g., N-dimensional point) to a nearest central point of a cluster.

In some arrangements, an association process based on weighted K-means clustering can be performed with a reduced latency using the hardware structure 1000 shown in FIG. 10. The hardware structure 1000 may include SRAM 1010, a weighted square error circuit 1030, a full adder 1040, a shift register or flip-flop 1050, a comparator 1060, and a shift register or flip-flop 1070.

In some arrangements, the SRAM 1010 may be implemented or included in SRAM 215 in FIG. 2. The SRAM 1010 may store central points 1012 (e.g., N-dimensional central points for clusters) and corresponding weights 1014 (e.g., N-dimensional weight vectors) as a result of clustering as a training process (that are calculated off-line). In some arrangements, $k^{th}$ row of SRAM 1010 may store a central point and its associated weight vector, such that information of a single central point and its corresponding weights can be extracted (or retrieved, accessed, obtained) in a single clock cycle.

In some arrangements, the weighted square error circuit 1030 may include two shift registers configured to input $i^{th}$ value of $k^{th}$ central point (CP$_{(k,i)}$) and $i^{th}$ value of $k^{th}$ weight vector (W$_{(k,i)}$), respectively. The weighted square error circuit 1030 may include a square error operator 1032 configured to calculate a square error based on (1) $i^{th}$ value ($v_1$) of a new input vector 1020 (e.g., N-dimensional vector ($v_1, v_2, \ldots, v_N$) representing a set of read thresholds) and (2) $i^{th}$ value of $k^{th}$ central point (CP$_{(k,i)}$) using the following equation:

$$MSE(k,i) = (CP_{(k,i)} - v_i)^2 \quad \text{(Equation 5),}$$

The weighted square error circuit 1030 may include a multiplier 1034 configured to calculate a weighted square error based on (1) MSE(k, i) as a result of the square error operator 1032 and (2) $i^{th}$ value of $k^{th}$ weight vector ($W_{(k,i)}$) using the following equation:

$$\text{Weighted\_MSE}(k,i) = w_{(k,i)} \cdot \text{MSE}(k,i) \quad \text{(Equation 6)},$$

In some arrangements, the full adder 1040 may be configured to add an output of the square error circuit 1030 and an output of the shift register 1050 so as to store or load a sum of weighted square errors in the shift register 1050. The shift register 1070 may be configured to store a sum of weighted square errors corresponding to a best candidate cluster. The comparator 1060 may be configured to compare an output of the shift register 1050 with that stored in the shift register 1070. In response to determining that the output of the shift register 1050 is smaller than that stored in the shift register 1070, the comparator 1060 may be configured update the shift register 1070 with the output of the shift register 1050.

Referring to FIG. 10, when a flash memory system (e.g., controller 220, read circuit 230, threshold associator 234 of SSD 200 in FIG. 2) receives (or calculates or obtains) a new input 1020 (e.g., input vector ($v_1, v_2, \ldots, v_N$)), the system may look for (or search for, retrieve) a nearest central point among the central points 1012 by performing the following S101 and S102 in this order.

In S101, the system may initialize the "best candidate" register 1070 with a maximum possible value (e.g., a maximum possible sum of weighted square errors over N dimensions). In S102, for each row k in SRAM 1010, the system may (1) initialize the "weighted-square error-sum" register 1050 with a zero value; (2) for each threshold i ($1 \le i \le N$), perform S102-1 to S102-4 in this order (described in the following section) to store the sum of N weighted square errors over $1 \le i \le N$ in the register 1050; and (3) perform S102-5 and S102-6 in this order (described in the following section) to obtain the "best candidate" cluster number that best fits to the new input 1020.

In S102-1, the system may read $CP_{(k,i)}$) and $W_{(k,i)}$ from SRAM 1010. In S102-2, the system may calculate MSE(k, i) based on (1) $i^{th}$ input value $v_i$ and (2) $i^{th}$ value of $k^{th}$ central point ($CP_{(k,i)}$) using the square error operator 1032. In S102-3, the system may calculate Weighted_MSE(k, i) based on (1) MSE(k, i) and (2) $i^{th}$ value of $k^{th}$ weight vector ($W_{(k,i)}$) using the multiplier 1034. In S102-4, the system may calculate sum of, or accumulate, the Weighted_MSE(k, i) over $1 \le i \le N$ using the full adder 1040 and store the sum of weighted square errors in the register 1050.

In S102-5, the system may compare the sum of N weighted square errors with the current value stored in the "best candidate" register 1070 using the comparator 1060. In S102-6, in response to determining that the sum of N weighted square errors is smaller than the current value stored in the "best candidate" register 1070, the system may update the "best candidate" register 1070 with the sum of N weighted square errors and update the "best candidate" cluster number with the current k value. In this manner, after completing the S102 (e.g., completing the calculation over all rows in SRAM 1010), the best-candidate cluster may refer to the cluster that best fits to the new input 1020.

In some arrangements, the S102-1 to S102-4 can be performed in pipe-line. In this case, the total latency of the search process can be O(NumOfThresholds (e.g., N)×NumOfClusters). The total latency in extracting or retrieving or accessing a set of thresholds (e.g., a central point) from the SRAM can be O(1). In the hardware structure 1000 in FIG. 10, the circuit 1030 functions as a general building block which is the most dominant part from logic cell point of view. Thus, the total number of logic-cells can be O(number of general building block)+one (Weighted-square error sum register 1050)+one (Best Candidate register 1070). The total SRAM size can be (NumOfThresholds×NumOfClusters×R) bits where R refers to the number of bits that represents threshold and weight in each dimension (or column)).

A tradeoff between the latency and the number of logic-cells can be utilized. For example, some applications may be more sensitive to latency, while other applications may be more sensitive to area. The tradeoff can be demonstrated in the section below with reference to FIG. 11. In order to accelerate the process, and reduce the latency of the search process (as illustrated in FIG. 10), it is possible to use multiple general building blocks (e.g., a plurality of basic building blocks each being similar to the circuit 1030). In that way, the search time can be reduced, on account of the growth of the gate-count.

Figure 11:
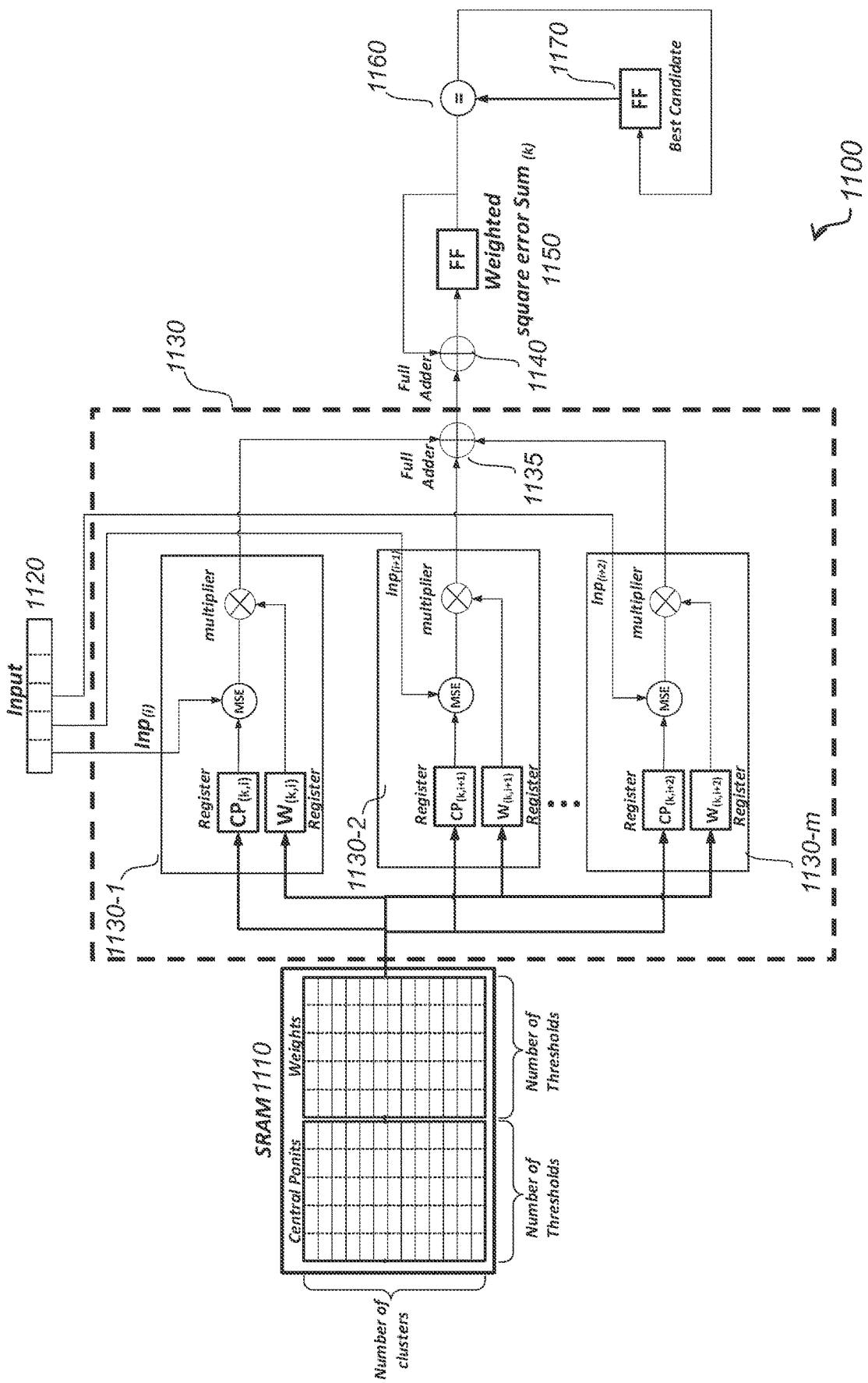
FIG. 11 is a diagram illustrating another example structure for associating input data with a cluster according to some arrangements.

FIG. 11 is a diagram illustrating another example structure for associating input data with a cluster according to some arrangements. In some arrangements, an association process (e.g., process 900 in FIG. 9) may be implemented with hardware configuration 1100 shown in FIG. 11.

In some arrangements, an association process based on weighted K-means clustering can be performed with a reduced latency using the hardware structure 1100 shown in FIG. 11. The hardware structure 1100 may include SRAM 1110, a full adder 1140, a shift register or flip-flop 1150, a comparator 1160, and a shift register or flip-flop 1170, which have configurations similar to those of SRAM 1010, full adder 1040, shift register or flip-flop 1050, comparator 1060, and shift register or flip-flop 1070 in FIG. 10, respectively.

In some arrangements, the hardware structure 1100 may include a weighted square error circuit 1130. The circuit 1130 may include a full adder 1135 and a plurality of weighted square error circuits 1130-1, 1130-2, ..., 1130-m, each functioning as a general building block having a configuration similar to that of the weighted square error circuit 1030 in FIG. 10. For example, the circuit 1130 includes three weighted square error circuits (m=3). In this case, the tradeoff can be demonstrated with three general building blocks, thus the latency can be reduced in factor of 3 times. In general, if m general building blocks are implemented, the latency can be accelerated to O(k*N/m) clock cycles instead of O(k*N) in structure 1000.

Referring to FIG. 11, when a flash memory system (e.g., controller 220, read circuit 230, threshold associator 234 of SSD 200 in FIG. 2) receives (or calculates or obtains) a new input 1120 (e.g., input vector ($v_1, v_2, \ldots, v_N$)), the system may look for (or search for, retrieve) a nearest central point among the central points 1012 by performing the S101 and S102 in this order as previously described in FIG. 10 except for (1) the range of threshold i ($1 \le i \le N$) is divided into m sub-ranges so that each of m weighted square error circuits 1130-1, 1130-2, ..., 1130-m performs S102-1 to S102-4 on a respective one of m sub-ranges to output a respective sum of weighted square errors over the respective sub-range and (2) based on the respective sums of weighted square errors, the full adder 1035 may calculate the total sum of weighted square errors over $1 \le i \le N$ to be inputted to the full adder 1140.

In some arrangements, as a result of a training process (e.g., training process 600, 700 in FIG. 6, FIG. 7A and FIG. 7B) and an association process (e.g., association process in FIG. 9 and/or association process using example hardware structure 1000, 1100 in FIG. 10 and FIG. 11), only a table with thresholds set value for each cluster can be stored, and for each block only the corresponding cluster number can be stored. When the optimal thresholds of a specific block are found (e.g., new input vector 1020, 1120 in FIG. 10 and FIG. 11), the search process can be performed in order to find the best central point that represents these optimal thresholds of this specific block, and only the row number of the best-candidate cluster in the SRAM can be stored as an index that represents the read-thresholds for that block. Later, when the same block is read, the thresholds for the block can be extracted or read or retrieved from the SRAM in O(1) clock cycles (because the system only needs to read the specific row from SRAM according to the index that is associated with this block). The fact that the extraction of the thresholds is performed in O(1) can significantly reduce the overall latency of the normal read command process, since in memory controllers the read-latency may dominate the overall latency.

In some arrangements, an early termination can be implemented to terminate the search for nearest cluster in case that the result (e.g., sum of weighted square errors for each row in SRAM 1010 in FIG. 10) is close enough (below a threshold). In this manner, the average latency of search process can be reduced although a tradeoff may exist between the average latency acceleration and the association accuracy.

Referring to FIG. 10, in the structure 1000, the process is performed iteratively threshold by threshold for each distance calculation to a central point. 7 times in TLC, 15 times in QLC. Referring to FIG. 11, in the structure 1100 the process is performed simultaneously on m thresholds at a time (m=the number of 1130 elements).

Figure 12:
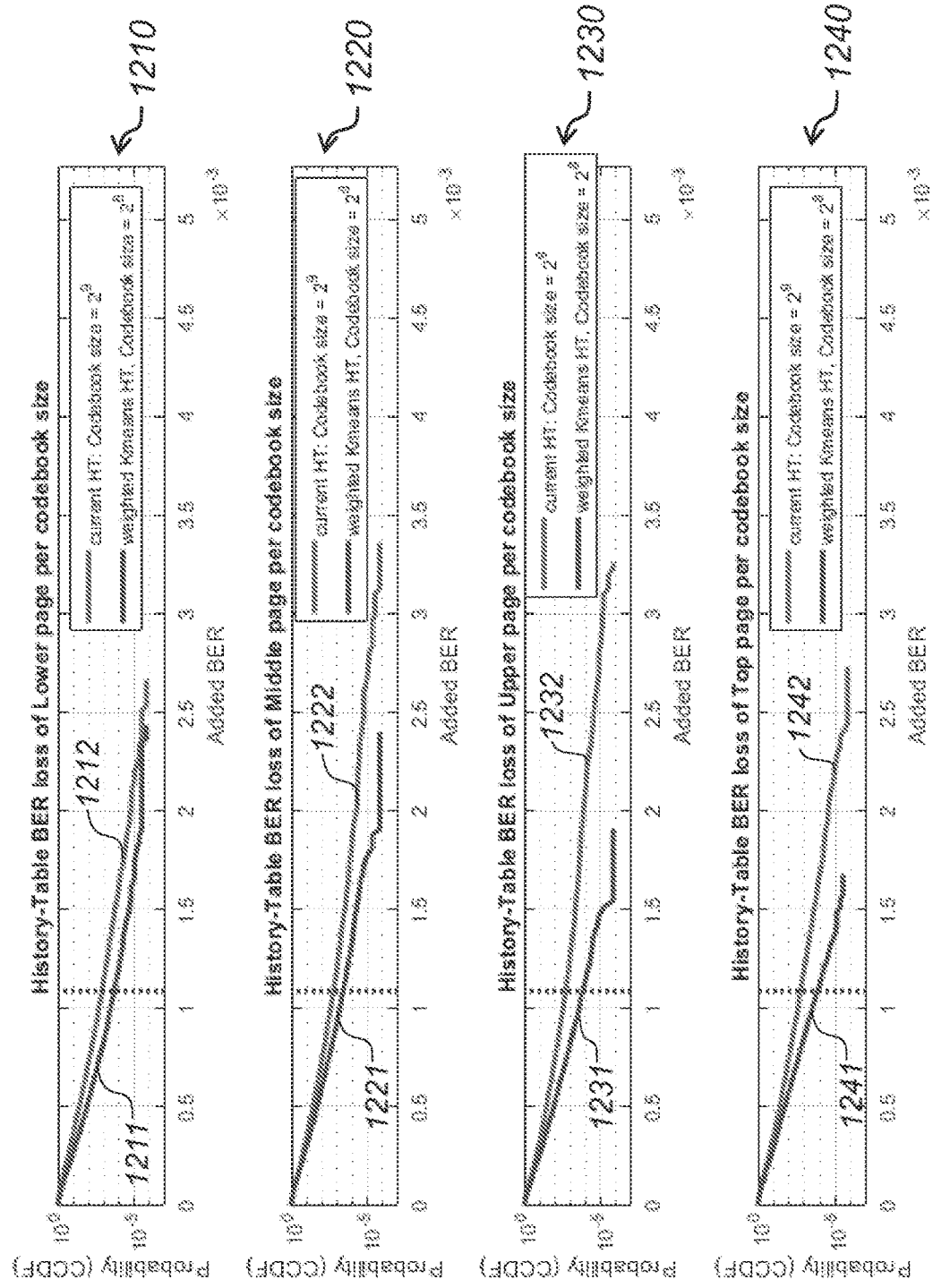
FIG. 12 illustrates example results of comparing performance obtained with conventional history table configurations with that of clustering methods according to some arrangements.

FIG. 12 illustrates example results of comparing performance obtained with conventional history table configurations with that of clustering methods according to some arrangements. A weighted K-means clustering method according to some arrangements was tested in a lab and compared to another quantization scheme (clustering to box shaped zones). In some arrangements, a history table may store an index of a cluster to which the last good thresholds-set of each block was associated using an association method and/or system (see FIG. 8A to FIG. 11). In some arrangements, the history table may be accompanied with a central-points table which store central points of clusters. With the history table and central-points table, the latest good thresholds can be stored, recorded, or remembered for further use.

FIG. 12 shows diagrams 1210, 1220, 1230, 1240 for history table BER loss of lower, middle, upper, top pages, respectively, in which the added BER complementary cumulative distribution function (CCDF) due to the weighted K-Means clustering (lines 1211, 1221, 1231, 1241) is compared to that (lines 1212, 1222, 1232, 1242) of the comparative quantization scheme using a test set of a flash memory device. The diagrams 1210, 1220, 1230, 1240 demonstrate that the weighted K-Means clustering provides much better performance compared to the comparative quantization scheme even with half number of clusters used. Better performance is manifested as the lines corresponding to the weighted K-Means clustering (lines 1211, 1221, 1231, 1241) are lower (e.g., having lower average added BER) and shorter (e.g., having smaller maximal added BER) than the lines (lines 1212, 1222, 1232, 1242) corresponding to the comparative quantization scheme.

Figure 13:
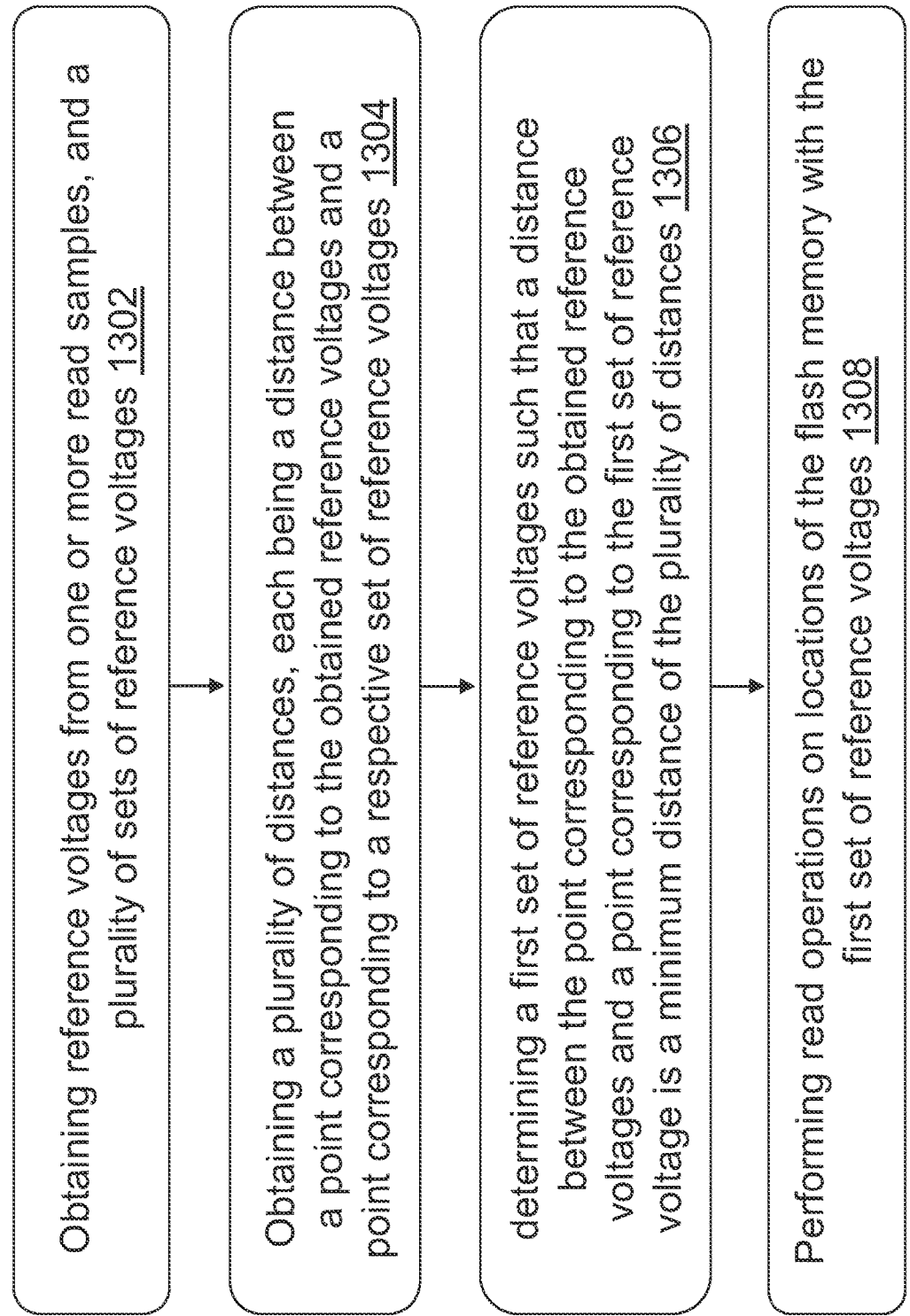
FIG. 13 is a flowchart illustrating an example methodology for associating input data with a cluster according to some arrangements.

FIG. 13 is a flowchart illustrating an example methodology for associating input data with a cluster according to some arrangements.

In some arrangements, the example methodology relates to a process 1300 for performing operations on a flash memory (e.g., flash memory 280 in FIG. 2) by a circuit (e.g., threshold associator 234, read circuit 230, controller 220 in FIG. 2) of a flash memory system (e.g., flash memory system 2000 in FIG. 2).

In this example, the process 1300 begins in S1302 by obtaining reference voltages from one or more read samples (e.g., input point $\bar{x}$ in FIG. 9, input vector 1020 in FIG. 10, input vector 1120 in FIG. 11), and a plurality of sets of reference voltages (e.g., K central points in table 810 in FIG. 8A, all central points of all clusters ($\bar{u}_1, \bar{u}_2, \ldots, \bar{u}_K$) in FIG. 9, central points 1012 in FIG. 10).

In S1304, in some arrangements, the circuit may be configured to obtain a plurality of distances (e.g., weighted distances (WD$_1$, WD$_2$, ..., WD$_K$) in FIG. 9), each being a distance between a point corresponding to the obtained reference voltages (e.g., input point $\bar{x}$ in FIG. 9, input vector 1020 in FIG. 10, input vector 1120 in FIG. 11) and a point corresponding to a respective set of reference voltages (e.g., each row of table 810 in FIG. 8A, each of central points of all clusters ($\bar{u}_1, \bar{u}_2, \ldots, \bar{u}_K$) in FIG. 9, each of central points 1012 in FIG. 10).

In some implementations, the point corresponding to the respective set of reference voltages may represent a cluster of a plurality of points. The point corresponding to the respective set of reference voltages (e.g., central point of a cluster) may be a weighted mean of the plurality of points (e.g., central point $\bar{u}$ calculated using Equation 2). The plurality of points may be obtained from a training set database.

In some implementations, the plurality of sets of reference voltages may be respectively associated with a plurality of sets of weights (e.g., set of weights in table 850 in FIG. 8B, weight vectors ($\bar{w}_1, \bar{w}_2, \ldots, \bar{w}_K$) in FIG. 9, weight vectors 1014 in FIG. 10). Each of the plurality of distances may be a weighted distance (e.g., weighted distances (WD$_1$, WD$_2$, ..., WD$_K$) in FIG. 9) between the point corresponding to the obtained reference voltages (e.g., vector $\bar{v}$ in Equation 1) and the point corresponding to the respective set of reference voltages (e.g., vector u in Equation 1) based on a corresponding set of weights (e.g., $w_i$ ($1 \leq i \leq N$) in Equation 1).

In some implementations, the flash memory system may include a first memory (e.g., SRAM 215 in FIG. 2, SRAM 1010 in FIG. 10, SRAM 1110 in FIG. 11) different form the flash memory. The plurality of sets of reference voltages (e.g., central points 1012 in FIG. 10) and the plurality of sets of weights (e.g., weight vectors 1014 in FIG. 10) may be stored in the first memory (e.g., SRAM 1010).

In some implementations, in obtaining the plurality of distances, for each of the plurality of sets of reference voltages as a current set of reference voltages (e.g., for each row kin SRAM 1010 in FIG. 10) wherein the obtained reference voltages and the current set of reference voltages have corresponding reference voltages (e.g., thresholds in N dimensions), the circuit may be configured to calculate a square error between the obtained reference voltages and the current set of reference voltages with respect to each of the corresponding reference voltages (e.g., calculating MSE(k, i) based on (1) $i^{th}$ input value $v_i$ and (2) $i^{th}$ value of $k^{th}$ central point (CP$_{(k,i)}$) using the square error operator 1032 in FIG. 10 using Equation 5). The circuit may be configured to calculate a weighted sum of the square errors of the current set of reference voltages over the corresponding reference voltages based on a set of weights corresponding to the current set of reference voltages (e.g., calculate Weighted_MSE(k, i) based on (1) MSE (k, i) and (2) $i^{th}$ value of $k^{th}$ weight vector ($W_{(k,i)}$) using the multiplier 1034 using Equation 6).

In some implementations, in calculating a weighted sum of the square errors of the current set of reference voltages over the corresponding reference voltages, the circuit may be configured to (1) calculate a first weighted sum of square errors of the current set of reference voltages over a first set of the corresponding reference voltages, (2) calculate a second weighted sum of square errors of the current set of reference voltages over a second set of the corresponding reference voltages, and (3) calculate a sum of the first weighted sum of square errors and the second weighted sum of square errors.

In some implementations, the circuit may include a first circuit (e.g., circuit 1130-1 in FIG. 11) and a second circuit (e.g., circuit 1130-2 in FIG. 11) different from the first circuit. The first circuit may be configured to calculate the first weighted sum of square errors of the current set of reference voltages. The second circuit may be configured to calculate the second weighted sum of square errors of the current set of reference voltages. For example, in FIG. 11, each of m weighted square error circuits 1130-1, 1130-2, . . . , 1130-$m$ may perform S102-1 to S102-4 on a respective one of m sub-ranges of the range of threshold i ($1 \leq i \leq N$) to output a respective sum of weighted square errors over the respective sub-range.

In S1306, in some arrangements, the circuit may be configured to determine a first set of reference voltages such that a distance between the point corresponding to the obtained reference voltages and a point corresponding to the first set of reference voltage is a minimum distance of the plurality of distances. In some implementations, the first set of reference voltages may have a minimum weighted sums of square errors among the plurality of sets of reference voltages. The minimum weighted sums of square errors may be a minimum square error (MSE). For example, in FIG. 9, the association process 900 may find or identify a smallest $WD_i$ among $WD_1, WD_2, \ldots, WD_K$ and associate input point $\bar{x}$ to the $i^{th}$ cluster with the minimal (smallest) weighted distance.

In S1308, in some arrangements, the circuit may be configured to perform read operations on locations of the flash memory with the first set of reference voltages. For example, in FIG. 9, the association process 900 may associate input point $\bar{x}$ (e.g., set of read thresholds calculated based on a particular block) to the $i^{th}$ cluster with the minimal (smallest) weighted distance, and output the cluster number i. The NAND device may be configured to perform read operations on the particular block using a set of read thresholds corresponding to the central point of the $i^{th}$ cluster (instead of using input point $\bar{x}$).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for performing operations on a flash memory, the method comprising:
    obtaining reference voltages from one or more read samples, and a plurality of sets of reference voltages;
    obtaining a plurality of distances, each one of the plurality of distances being a distance between a point corresponding to the obtained reference voltages and a point corresponding to a respective set of reference voltages;
    determining a first set of reference voltages such that a distance of the plurality of distances between the point corresponding to the obtained reference voltages and a point corresponding to the first set of reference voltages is a minimum distance of the plurality of distances; and
    performing read operations on locations of the flash memory with the first set of reference voltages.

2. The method of claim 1, wherein the point corresponding to the respective set of reference voltages represents a cluster of a plurality of points.

3. The method of claim 2, wherein the point corresponding to the respective set of reference voltages is a weighted mean of the plurality of points.

4. The method of claim 1, wherein the plurality of sets of reference voltages are respectively associated with a plurality of sets of weights.

5. The method of claim 4, wherein each of the plurality of distances is a weighted distance between the point corresponding to the obtained reference voltages and the point corresponding to the respective set of reference voltages based on a corresponding set of weights.

6. The method of claim 4, wherein the plurality of sets of reference voltages and the plurality of sets of weights are stored in a first memory different form the flash memory.

7. The method of claim 4, wherein
    obtaining the plurality of distances comprises:
    for each of the plurality of sets of reference voltages as a current set of reference voltages wherein the obtained reference voltages and the current set of reference voltages have corresponding reference voltages,
    calculating a square error between the obtained reference voltages and the current set of reference voltages with respect to each of the corresponding reference voltages, and
    calculating a weighted sum of the square errors of the current set of reference voltages over the corresponding reference voltages based on a set of weights corresponding to the current set of reference voltages.

8. The method of claim 7, wherein the first set of reference voltages has a minimum weighted sums of square errors among the plurality of sets of reference voltages.

9. The method of claim 7, wherein calculating a weighted sum of the square errors of the current set of reference voltages over the corresponding reference voltages comprises:
    calculating a first weighted sum of square errors of the current set of reference voltages over a first set of the corresponding reference voltages;
    calculating a second weighted sum of square errors of the current set of reference voltages over a second set of the corresponding reference voltages; and
    calculating a sum of the first weighted sum of square errors and the second weighted sum of square errors.

10. The method of claim 9, wherein
    the first weighted sum of square errors of the current set of reference voltages is calculated using a first circuit, and
    the second weighted sum of square errors of the current set of reference voltages is calculated using a second circuit different from the first circuit.

11. A flash memory system comprising:
    a flash memory; and
    a circuit for performing operations on the flash memory, the circuit being configured to:
    obtain reference voltages from one or more read samples, and a plurality of sets of reference voltages;
    obtain a plurality of distances, each one of the plurality of distances being a distance between a point corresponding to the obtained reference voltages and a point corresponding to a respective set of reference voltages;
    determine a first set of reference voltages such that a distance of the plurality of distances between the point corresponding to the obtained reference voltages and a point corresponding to the first set of reference voltage is a minimum distance of the plurality of distances; and perform read operations on locations of the flash memory with the first set of reference voltages.

12. The flash memory system of claim 11, wherein the point corresponding to the respective set of reference voltages represents a cluster of a plurality of points.

13. The flash memory system of claim 12, wherein the point corresponding to the respective set of reference voltages is a weighted mean of the plurality of points.

14. The flash memory system of claim 11, wherein the plurality of sets of reference voltages are respectively associated with a plurality of sets of weights.

15. The flash memory system of claim 14, wherein each of the plurality of distances is a weighted distance between the point corresponding to the obtained reference voltages and the point corresponding to the respective set of reference voltages based on a corresponding set of weights.

16. The flash memory system of claim 14, further comprising:

a first memory different form the flash memory, wherein the plurality of sets of reference voltages and the plurality of sets of weights are stored in the first memory.

17. The flash memory system of claim 14, wherein in obtaining the plurality of distances, the circuit is configured to:

for each of the plurality of sets of reference voltages as a current set of reference voltages wherein the obtained reference voltages and the current set of reference voltages have corresponding reference voltages, calculate a square error between the obtained reference voltages and the current set of reference voltages with respect to each of the corresponding reference voltages, and calculate a weighted sum of the square errors of the current set of reference voltages over the corresponding reference voltages based on a set of weights corresponding to the current set of reference voltages.

18. The flash memory system of claim 17, wherein the first set of reference voltages has a minimum weighted sums of square errors among the plurality of sets of reference voltages.

19. The flash memory system of claim 17, wherein in calculating a weighted sum of the square errors of the current set of reference voltages over the corresponding reference voltages, the circuit is configured to:

calculate a first weighted sum of square errors of the current set of reference voltages over a first set of the corresponding reference voltages;

calculate a second weighted sum of square errors of the current set of reference voltages over a second set of the corresponding reference voltages; and calculate a sum of the first weighted sum of square errors and the second weighted sum of square errors.

20. The flash memory system of claim 19, wherein the circuit comprises a first circuit and a second circuit different from the first circuit, the first circuit is configured to calculate the first weighted sum of square errors of the current set of reference voltages, and the second circuit is configured to calculate the second weighted sum of square errors of the current set of reference voltages.

* * * * *